United States Patent
Bakr et al.

(10) Patent No.: US 10,483,046 B2
(45) Date of Patent: Nov. 19, 2019

(54) ORGANOMETALLIC HALIDE PEROVSKITE SINGLE CRYSTALS HAVING LOW DEFECT DENSITY AND METHODS OF PREPARATION THEREOF

(71) Applicant: KING ABDULLAH UNIVERSITY OF SCIENCE AND TECHNOLOGY, Thuwal (SA)

(72) Inventors: Osman M. Bakr, Thuwal (SA); Dong Shi, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 104 days.

(21) Appl. No.: 15/503,544

(22) PCT Filed: Aug. 12, 2015

(86) PCT No.: PCT/IB2015/001502
§ 371 (c)(1),
(2) Date: Feb. 13, 2017

(87) PCT Pub. No.: WO2016/024159
PCT Pub. Date: Feb. 18, 2016

(65) Prior Publication Data
US 2017/0236651 A1    Aug. 17, 2017

Related U.S. Application Data

(60) Provisional application No. 62/037,270, filed on Aug. 14, 2014.

(51) Int. Cl.
| | | |
|---|---|---|
| H01G 9/20 | (2006.01) |
| C30B 7/14 | (2006.01) |
| C30B 29/54 | (2006.01) |
| H01L 51/00 | (2006.01) |
| H01L 51/42 | (2006.01) |

(52) U.S. Cl.
CPC ............ *H01G 9/2009* (2013.01); *C30B 7/14* (2013.01); *C30B 29/54* (2013.01); *H01L 51/0007* (2013.01); *H01L 51/0077* (2013.01); *H01L 51/42* (2013.01)

(58) Field of Classification Search
None
See application file for complete search history.

(56) References Cited

FOREIGN PATENT DOCUMENTS

GB          665 806 A          1/1952

OTHER PUBLICATIONS

Xiao et al. Angew. Chem. Int. Ed. 2014, 53, 9898-9903.*
International Search Report and Written Opinion of Application No. PCT/IB2015/001502 dated Dec. 4, 2015, 14 pages.
(Continued)

*Primary Examiner* — Clinton A Brooks
(74) *Attorney, Agent, or Firm* — Billion & Armitage; Gregory S. Schwartz

(57) ABSTRACT

Embodiments of the present disclosure provide for single crystal organometallic halide perovskites, methods of making, methods of use, devices incorporating single crystal organometallic halide perovskites, and the like.

14 Claims, 19 Drawing Sheets

(56) References Cited

OTHER PUBLICATIONS

Qi Chen et al: "Planar heterojunction perovskite solar cells via vapor-assisted solution process", Journal of the American Chemical Society, Jan. 15, 2014 (Jan. 15, 2014), pp. 622-625, XP055213449.
Moore David T et al: "Impact of the organic halide salt on final perovskite composition for photovoltaic applications", APL Materials, American Institute of Physics, 2 Huntington Quadrangle. Melville. NY 11747, vol. 2, No. 8, Aug. 1, 2014 (Aug. 1, 2014), XP812187774.
Nrel, "National Renewable Energy Laboratoty, Best Research-Cell Efficiencies Records Chart", Transforming Energy, Jan. 2019, 1 page.
Jansen et al., "Non-Empirical Molecular Orbital Calculations on The Protonation of Carbon Monoxide", Chemical Physics Letters, Mar. 1969, 140-143.
Peng, et al., "Organohalide Lead Perovskites for Photovoltaic Applications", Energy Environ Sci, 2014, 2448-2463.
Ayres, "Characterization of trapping states in polycrystalline-silicon thin film transistors by deep level transient spectroscopy", Journal of Applied Physics, 1993, 1787-1792.
Balcioglu, et al., "Deep-level impurities in CdTe/CdS thin-film solar cells", J. Appl. Phys., 2000, 7175-7178.
Benvenuti, et al., "Crystallization of soluble proteins in vapor diffusion for x-ray crystallography", Nat Protocols, 2007, 1633-1651.
Bork, et al., "Reactions and Reaction Rate of Atmospheric SO2 and O3—(H2O)n Collisions via Molecular Dynamics Simulations", The Journal of Physical Chemistry, 2013, 3143-3148.
Boys, "The calculation of small molecular interactions by the differences of separate total energies. Some procedures with reduced errors", Molecular Physics, 1970, 553-566.
Buin, et al., "Materials Processing Routes to Trap-Free Halide Perovskites", Nano Letters, 2014, 6281-6286.
Burschka, et al., "Sequential deposition as a route to high-performance perovskite-sensitized solar cells", Nature, vol. 499, Jul. 18, 2013, 316-319.
Capan, et al., "Dislocation-related deep levels in carbon rich p-type polycrystalline silicon", Sol Energy Mater Sol Cells, 2007, 931-937.
Chen, et al., "Planar Heterojunction Perovskite Solar Cells via Vapor-Assisted Solution Process", J Am Chem Soc, 2014, 622-625.
Choi, et al., "Structure of Methylammonium Lead Iodide Within Mesoporous Titanium Dioxide: Active Material in High-Performance Perovskite Solar Cells", Nano Letters, 2013, 127-133.
Chung, et al., "All-solid-state dye-sensitized solar cells with high efficiency", Nature, 2012, 486-489.
Cohen, et al., "Parameters influencing the deposition of methylammonium lead halide iodide in hole conductor free perovskite-based solar cells", APL Materials, 2014, 1-9.
Colella, et al., "MAPbI3-xClx Mixed Halide Perovskite for Hybrid Solar Cells: The Role of Chloride as Dopant on the Transport and Structural Properties", Chemistry of Materials, 2013, 4613-4618.
Del Alamo, "Nanometre-scale electronics with III-V compound semiconductors", Macmillan Publishers Limited. All rights reserved, Nov. 17, 2011, 317-323.
Duan, et al., "Vacancies and interstitials in indium nitride: Vacancy clustering and molecular bondlike formation from first principles", Physical Review B 79, 2009, 1-9.
Edri, et al., "Chloride Inclusion and Hole Transport Material Doping to Improve Methyl Ammonium Lead Bromide Perovskite-Based High Open-Circuit Voltage Solar Cells", J Phys Chem Left, 2014, 429-433.
Edri, et al., "High Open-Circuit Voltage Solar Cells Based on Organic-Inorganic Lead Bromide Perovskite", J Phys Chem Lett, 2013, 897-902.
El-Ballouli, et al., "Quantum Confinement—Tunable Ultrafast Charge Transfer at the PbS Quantum Dot and Phenyl-C61-butyric Acid Methyl Ester Interface", J Am Chem Soc, 2014, 6952-6959.

Eperon, "Morphological Control for High Performance, Solution-Processed Planar Heterojunction Perovskite Solar Cells", Adv Fund Mater, 2014, 151-157.
Etgar, et al., "Mesoscopic CH3NH3PbI3/TiO2 Heterojunction Solar Cells", J Am Chem Soc, 2012, 17396-17399.
Even, et al., "Importance of Spin-Orbit Coupling in Hybrid Organic/Inorganic Perovskites for Photovoltaic Applications", The Journal of Physical Chemistry Letters, 2013, 2999-3005.
Giacomo, et al., "Cation Role in Structural and Electronic Properties of 3D Organic-Inorganic Halide Perovskites: A DFT Analysis", The Journal of Physical Chemistry, 2014, 12176-12183.
Giacomo, et al., "Organic-inorganic halide perovskites: an ambipolar class of materials with enhanced photovoltaic performances", Journal of Materials Chemistry A, 2015, 8981-8991.
Goldmann, et al., "Determination of the interface trap density of rubrene single-crystal field-effect transistors and comparison to the bulk trap density", Journal of applied physics 2006, 99(3): 034507, 2006.
Goldmann, et al., "Evidence of water-related discrete trap state formation in pentacene single-crystal field-effect transistors", Appl. Phys. Lett. 88, 2006, 1-4.
Green, et al., "The emergence of perovskite solar cells", Nat Photon, 2014, 506-514.
Hartwigsen, et al., "Relativistic separable dual-space Gaussian pseudopotentials from H to Rn", Physical Review B, Aug. 15, 1998, 3641-3662.
Haynes, et al., "The Mobility and Life of Injected Holes and Electrons in Germanium", Physical Review, 1951, 835-843.
Haynes, et al., "Trapping of minority carriers in silicon. II. n-type silicon", Physical Review 100(2): 606. [0124] 37, 1955, 606-617.
Hornbeck, et al., "Trapping of minority carriers in silicon. 1. p-type silicon", Physical Review 97(2): 311, 1955, 311-323.
Hu, et al., "Investigating minority carrier trapping in n-type Cz silicon by transient photoconductance measurements", Journal of Applied Physics, 2012, 1-7.
Jagirdar, et al., "Organometallic Fluorides of The Main Group Metals", Progress in Inorganic Chemistry; vol. 48, 1999, 406-603.
Jeon, "Solvent engineering for high-performance inorganic-organic hybrid perovskite solar cells", Nature Materials, Sep. 2014, 897-903.
Kim, et al., "Lead Iodide Perovskite Sensitized All-Solid-State Submicron Thin Film Mesoscopic Solar Cell with Efficiency Exceeding 9%", www.nature.com/scientificreports, 7 pages, Aug. 21, 2012.
Kojima, et al., "Organometal Halide Perovskites as Visible-Light Sensitizers for Photovoltaic Cells", J Am Chem Soc, 2009, 6050-6051.
Perdew, et al., "Generalized Gradient Approximation Made Simple", Physical Review Letters, Oct. 28, 1996, 3865-3868.
Lee, et al., "Efficient Hybrid Solar Cells Based on Meso Superstructured Organometal Halide Perovskites", Science, vol. 338, pp. 643-647, Nov. 2, 2012.
Leitsmann, et al., "Adsorption mechanisms of fluorocarbon polymers at ultra low-k surfaces", Surface Science, 2010, 1808-1812.
Liang, et al., "Additive Enhanced Crystallization of Solution-Processed Perovskite for Highly Efficient Planar-Heterojunction Solar Cells", Adv Mater, 2014, 3748-3754.
Liu, et al., "Efficient planar heterojunction perovskite solar cells by vapour deposition", Nature, vol. 501, Sep. 19, 2013, 395-398.
Liu, et al., "Perovskite solar cells with a planar heterojunction structure prepared using room-temperature solution processing techniques", Nature Photonics, vol. 8, www.nature.com/naturephotonics, 2014, 133-138.
Mark, et al., "Space-Charge-Limited Currents in Organic Crystals", J Appl Phys, 1962, 205-215.
Mitzi, et al., "Synthesis, Structure, and Properties of Organic-Inorganic Perovskites and Related Materials. Progress in Inorganic Chemistry", vol. 48. John Wiley & Sons, Inc., 1990, 1-305.
Mosconi, et al., "First-Principles Modeling of Mixed Halide Organometal Perovskites for Photovoltaic Applications", The Journal of Physical Chemistry, 2013, 13902-13913.
Park, et al., "Organometal Perovskite Light Absorbers Toward a 20% Efficiency Low-Cost Solid-State Mesoscopic Solar Cell", J Phys Chem Lett, 2013, 2423-2429.

(56) References Cited

OTHER PUBLICATIONS

Poglitsch, et al., "Dynamic disorder in methylammoniumtrihalogenoplumbates (II) observed by millimeter-wave spectroscopy", The Journal of Chemical Physics, 1987, 6373-6378.
Razeghi, "Fundamentals of Solid State Engineering", Kluwer Academic Publishers, 2009, 1-630.
Yang, et al., "Deep-level defect characteristics in pentacene organic thin films", Applied physics letters, 2002, 1595-1597.
Yin, et al., "Unusual defect physics in CH3NH3PbI3 perovskite solar cell absorber", Appl. Phys. Lett. 104, 2014, 1-5.
Schulz, et al., "Interface energetics in organo-metal halide perovskite-based photovoltaic cells", Energy Environ Sci, 2014, 1377-1381.
Smecca, et al., "Spectroscopic and Theoretical Study of the Grafting Modes of Phosphonic Acids on ZnO Nanorods", The Journal of Physical Chemistry, 2013, 5364-5372.
Snaith, "Perovskites: The Emergence of a New Era for Low-Cost, High-Efficiency Solar Cells", J Phys Chem Lett, 2013, 3623-3630.
Stranks, et al., "Electron-Hole Diffusion Lengths Exceeding 1 Micrometer in an Organometal Trihalide Perovskite Absorber", Science, Oct. 18, 2013, 341-344.
Stranks, et al., "Recombination Kinetics in Organic-Inorganic Perovskites: Excitons, Free Charge, and Subgap States", Physical Review Applied, 2014, 1-8.
T. C. Sum, et al., "Advancements in perovskite solar cells: photophysics behind the photovoltaics", Energy Environ. Sci. 7, 2014, 2518-2534.
Takaluoma, et al., "Molecular Dynamics Simulation of the Solid-State Topochemical Polymerization of S2N2", Inorganic Chemistry, 2013, 4648-4657.
Tidhar, et al., "Crystallization of Methyl Ammonium Lead Halide Perovskites: Implications for Photovoltaic Applications", JACS; American Chemical Society, 2014, 13249-13256.
Vandevondele, "Gaussian basis sets for accurate calculations on molecular systems in gas and condensed phases", 2007, 1-10.
Versluys, et al., "DLTS and admittance measurements on CdS/CdTe solar cells", Thin Solid Films 431-432, 2003, 148-152.
Wang, et al., "Low-Temperature Processed Electron Collection Layers of Graphene/TiO2 Nanocomposites in Thin Film Perovskite Solar Cells", Nano Lett. 14,, Dec. 16, 2013, 724-730.
Wehrenfennig, et al., "Charge-carrier dynamics in vapour-deposited films of the organolead halide perovskite CH3NH3PbI3-xClx", Energy Environ Sci, 2014, 2269-2275.
Wehrenfennig, et al., "High charge carrier mobilities and lifetimes in organolead trihalide perovskites", Adv Mater, 2014, 1584-1589.
William, et al., "Numerical Recipes", The Art of Scientific Computing, Third Edition, 1-1235.
Wojciechowski, et al., "Sub-150 [degree] C. processed meso-superstructured perovskite solar cells with enhanced efficiency", Energy & Environmental Science, 2014, 1142-1147.
Xing, et al., "Long-range balanced electron- and hole-transport lengths in organic-inorganic CH3NH3PbI3", Science, 2013, 344-347.

\* cited by examiner

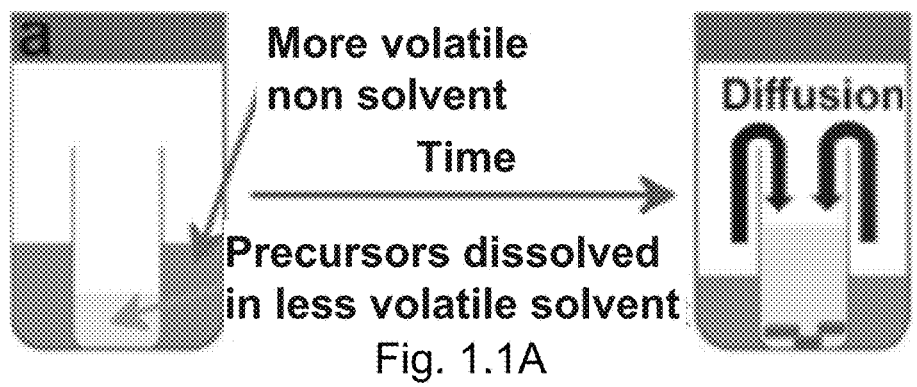
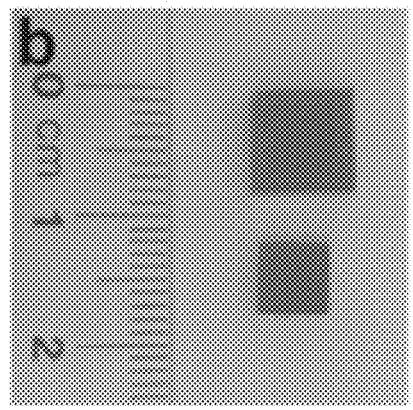
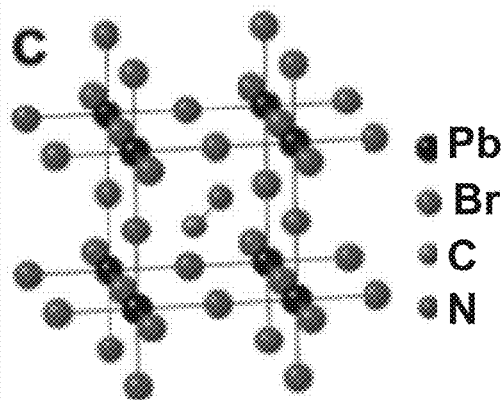
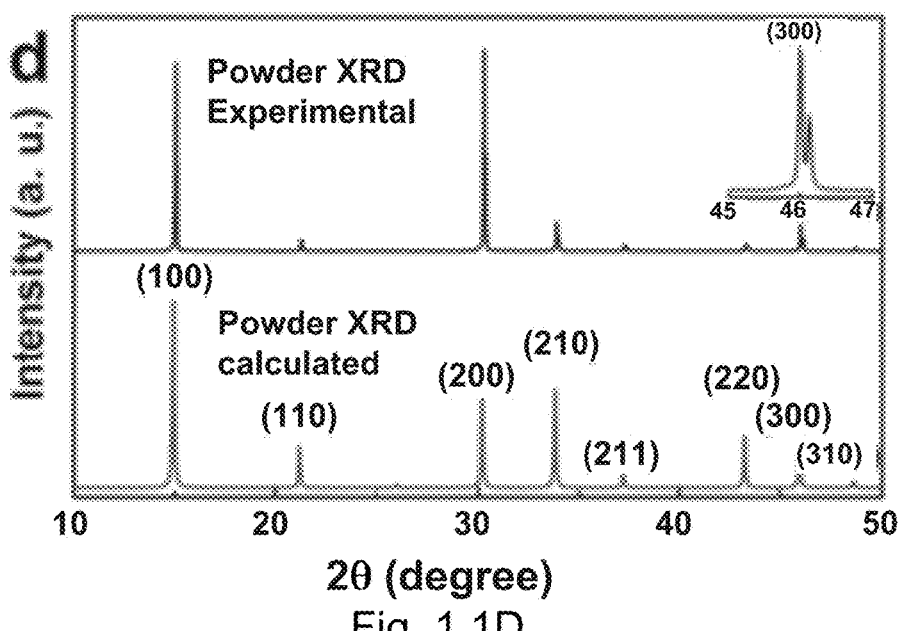
Fig. 1.1A
Fig. 1.1B
Fig. 1.1C
Fig. 1.1D

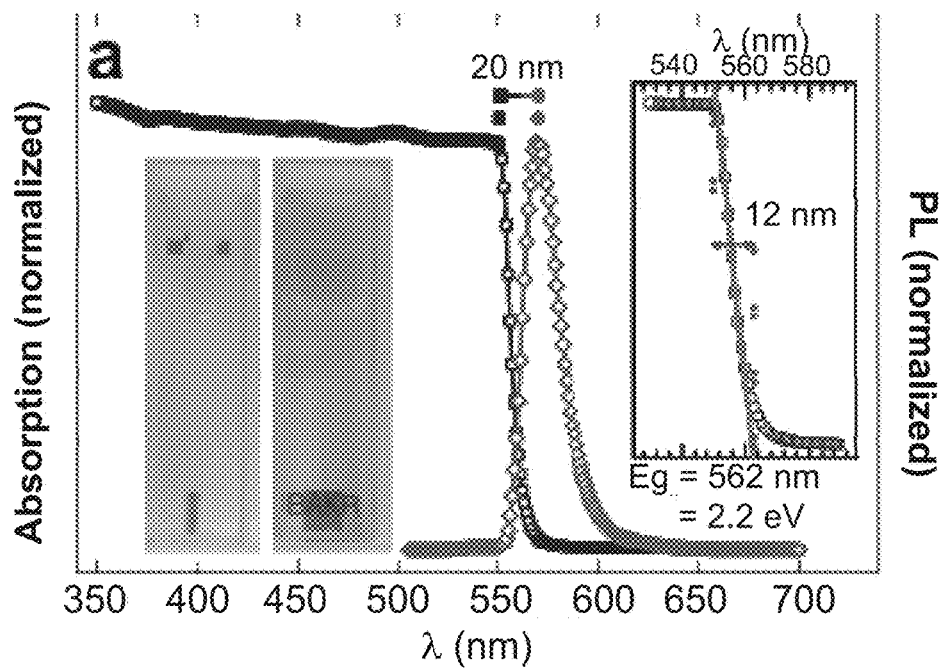
Fig. 1.2A
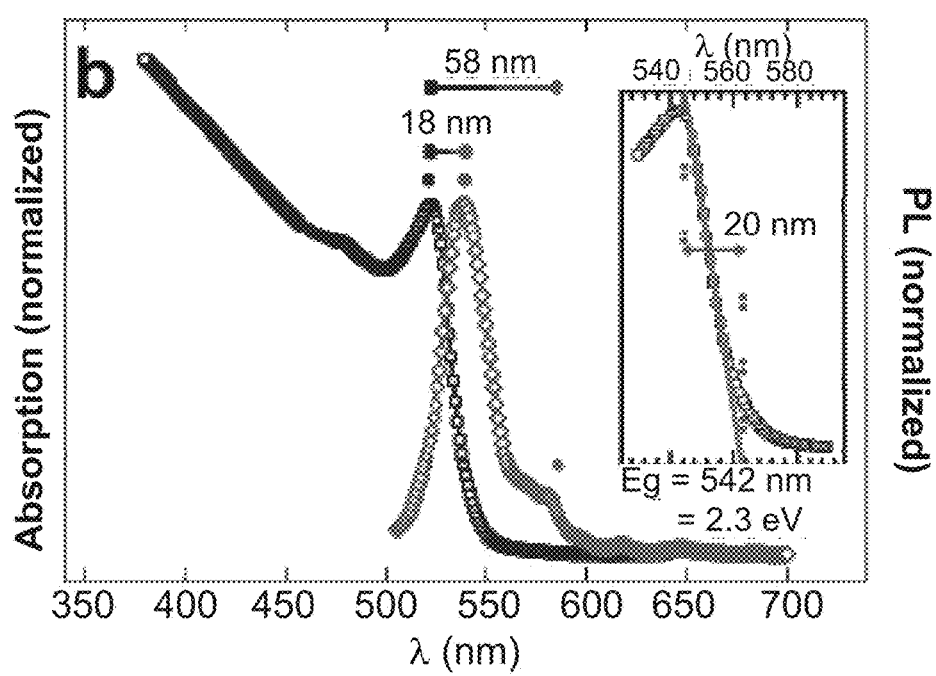
Fig. 1.2B

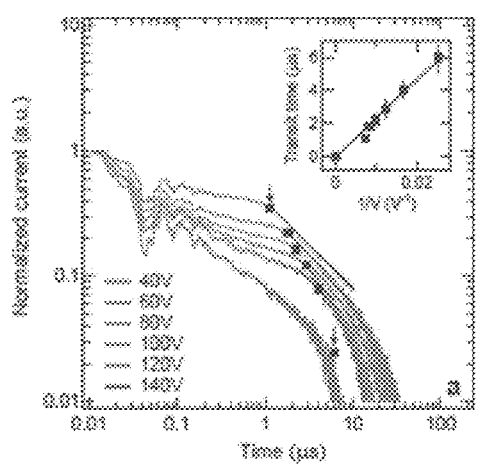
Fig. 1.3A
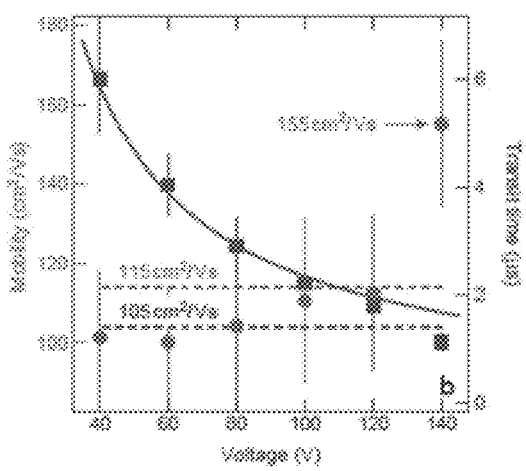
Fig. 1.3B
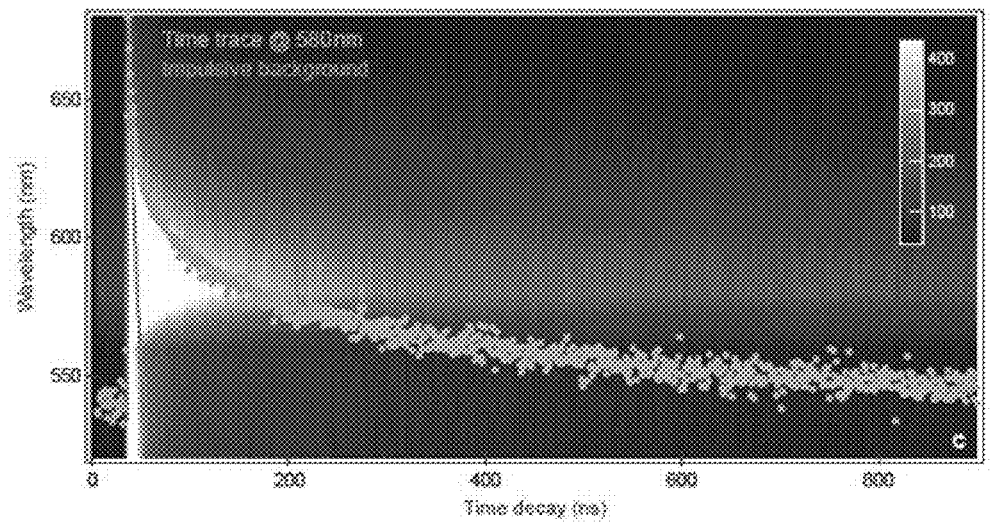
Fig. 1.3C
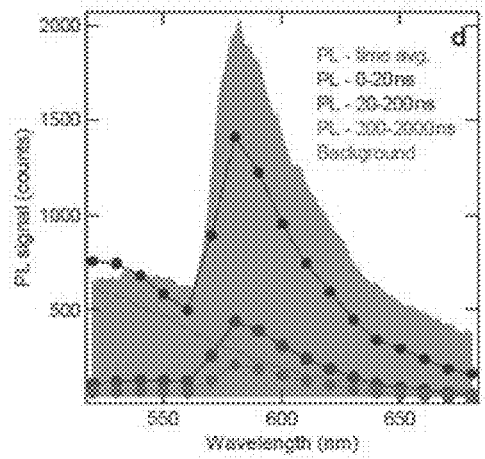
Fig. 1.3D
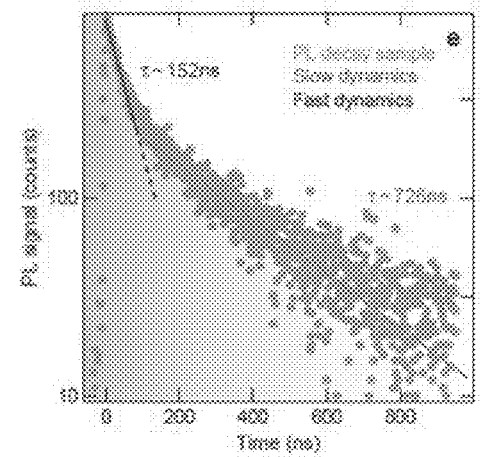
Fig. 1.3E

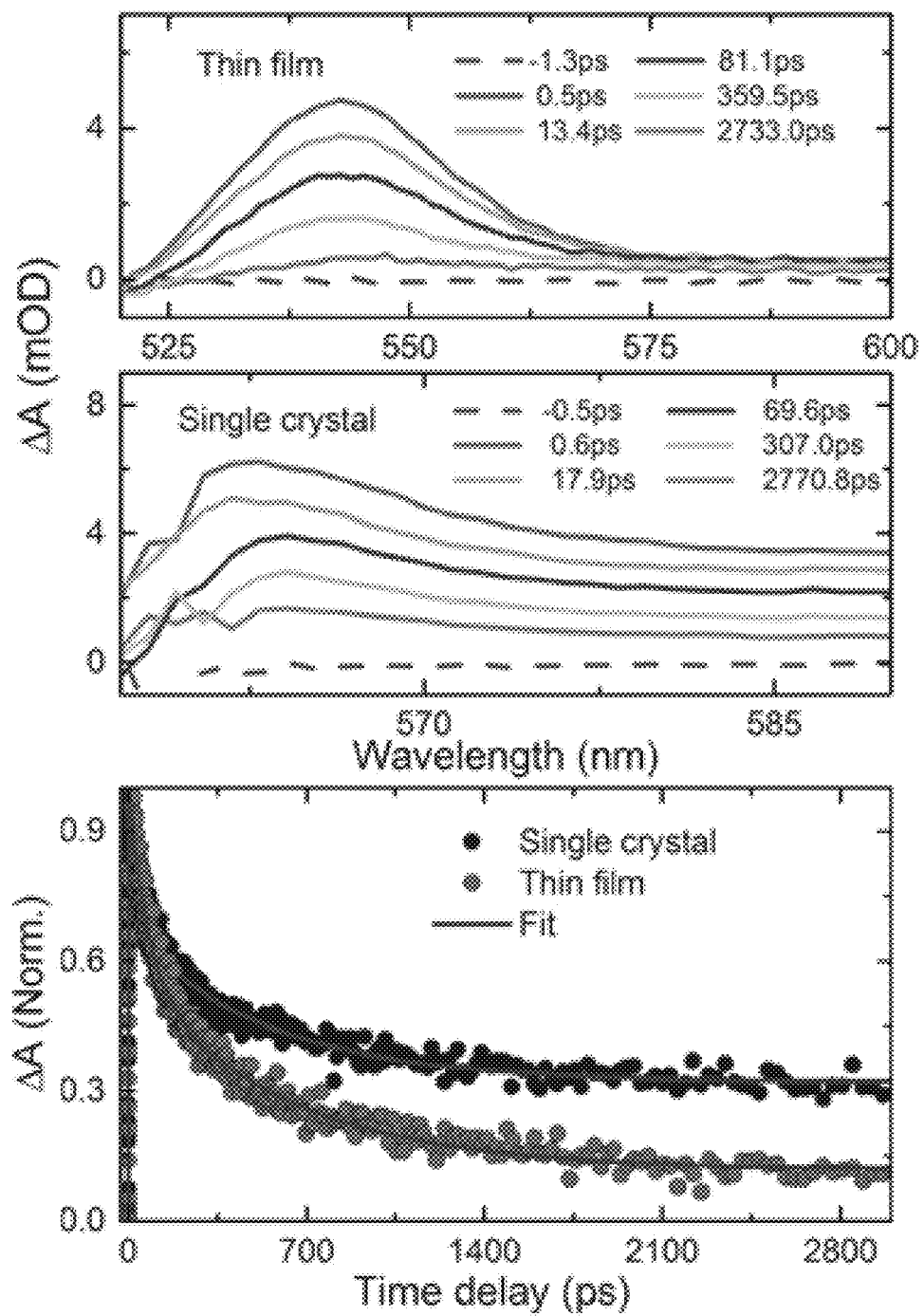
Fig. 1.4

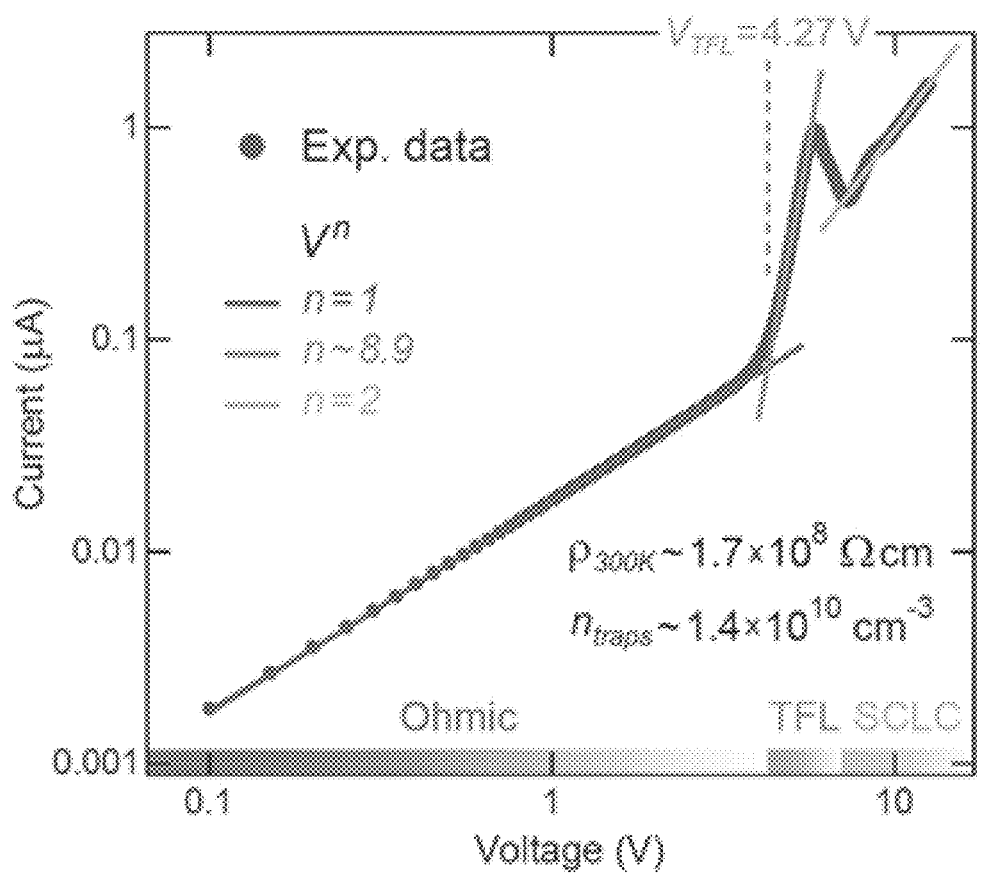
Fig. 1.5
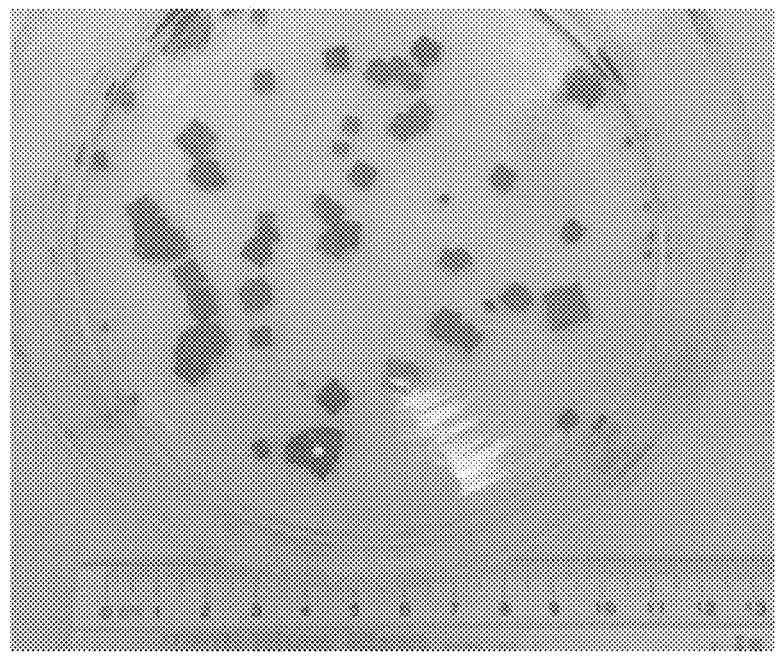
Fig. 1.6

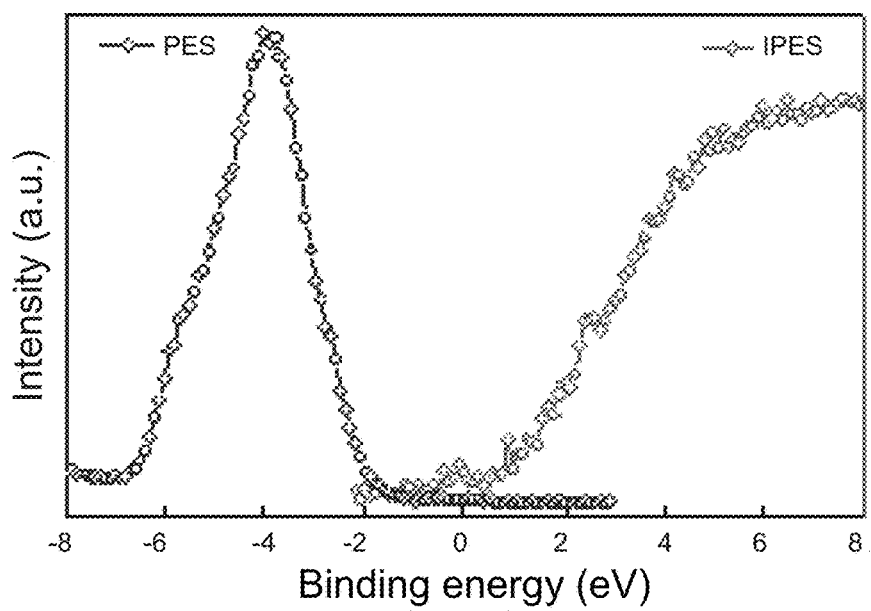
Fig. 1.7
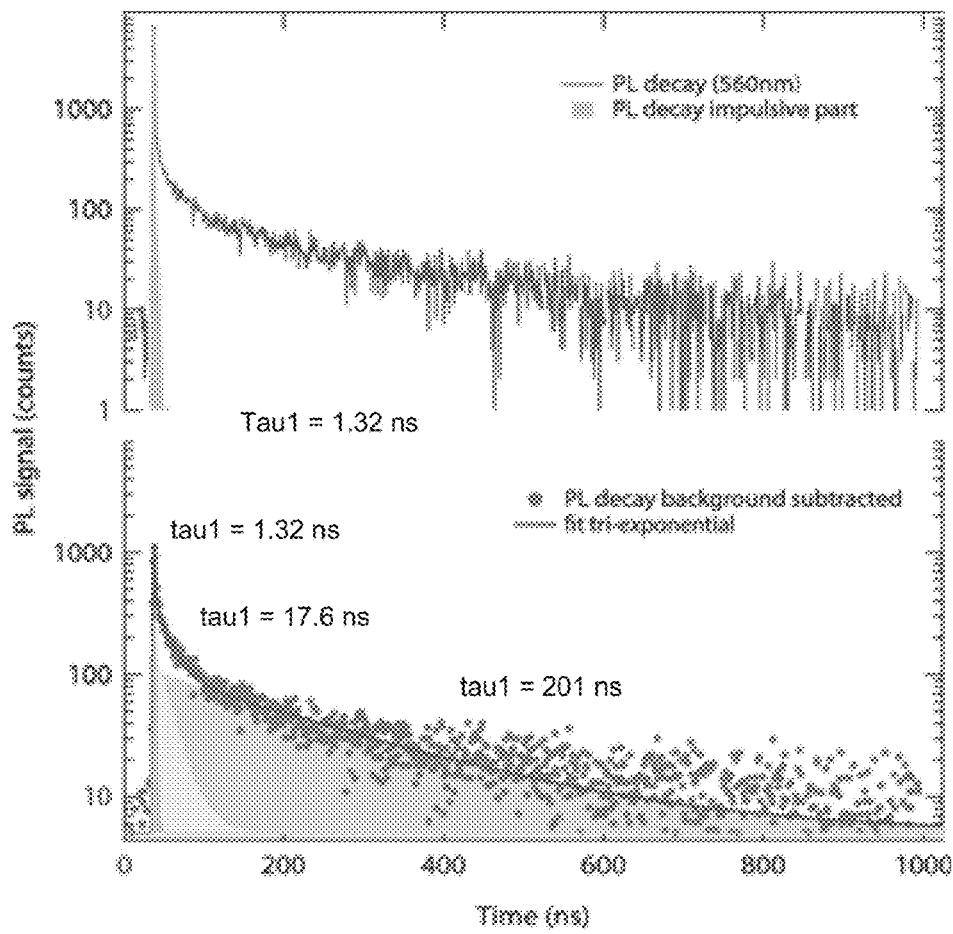
Fig. 1.8

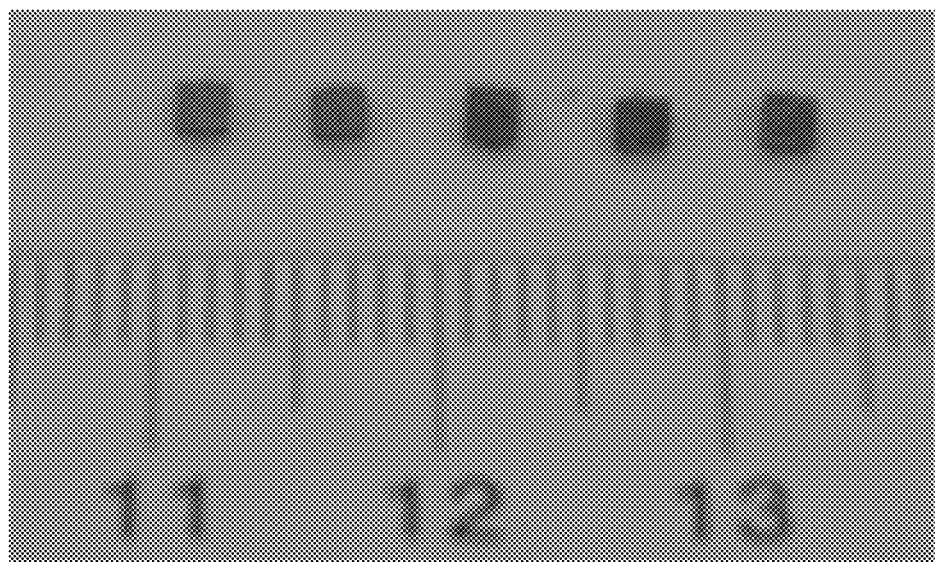
Fig. 1.9

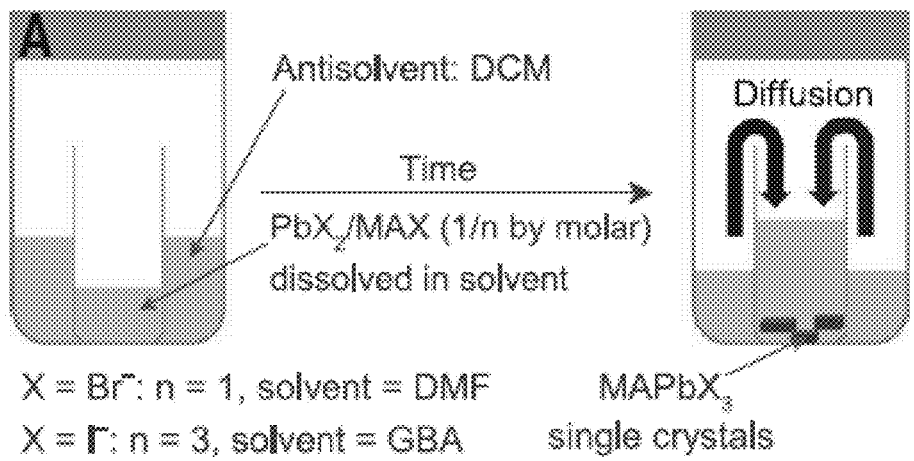
Fig. 2.1A
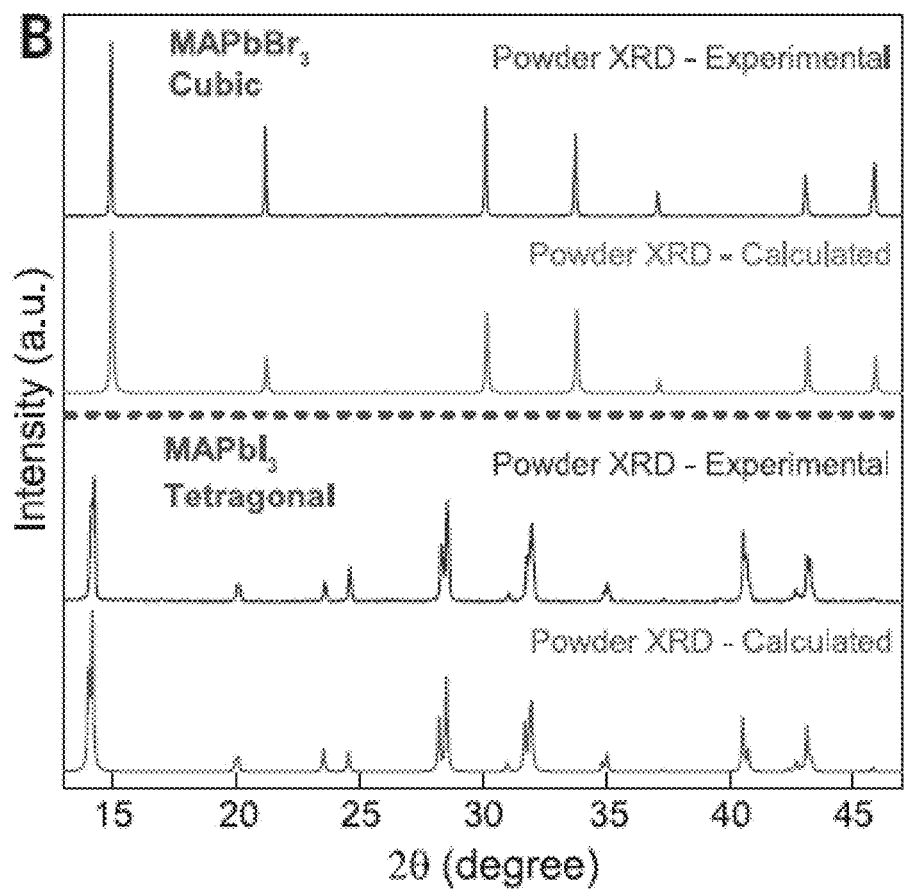
Fig. 2.1B

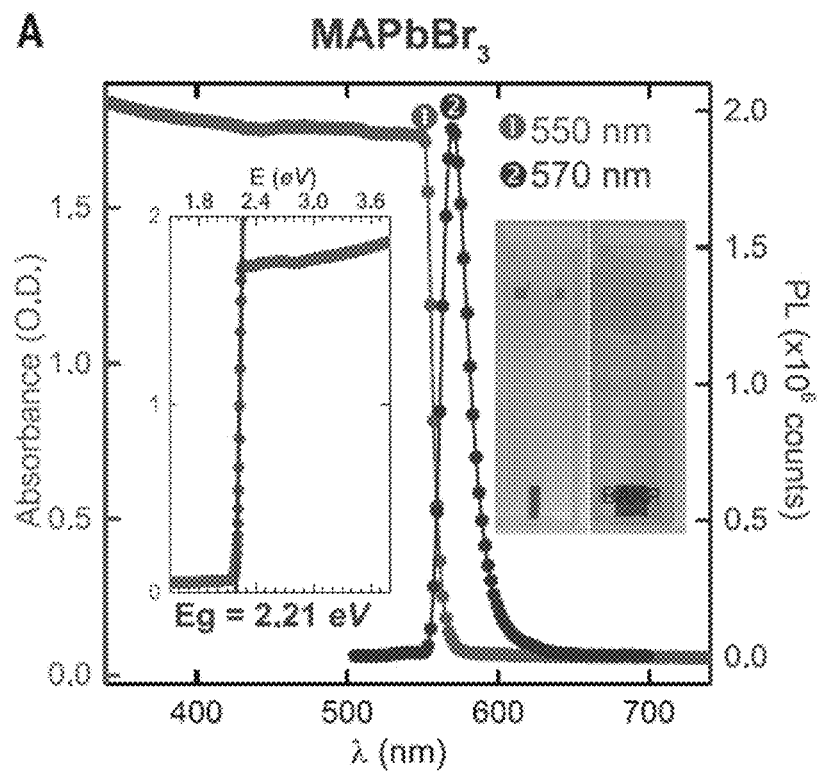
Fig. 2.2A
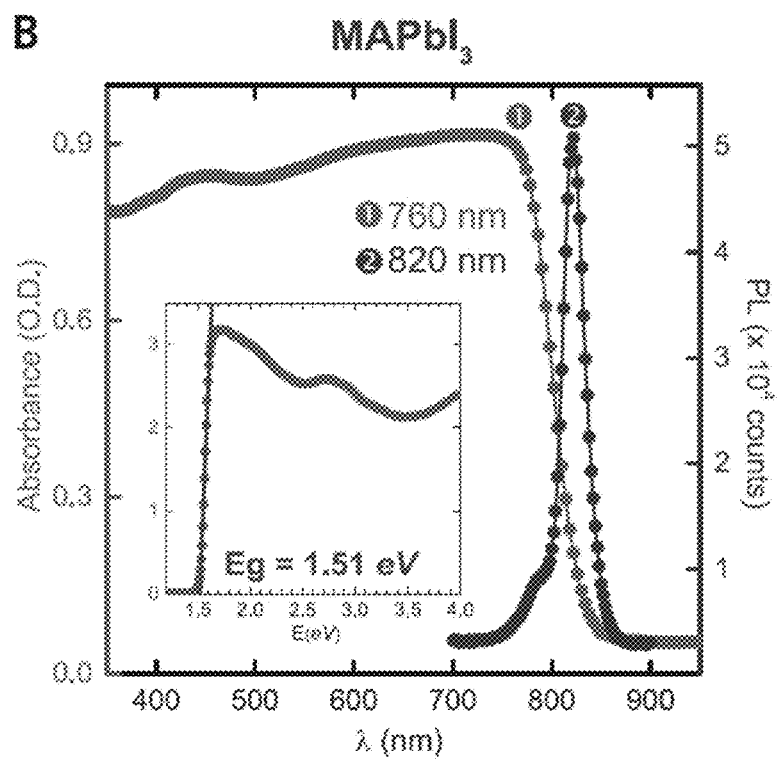
Fig. 2.2B

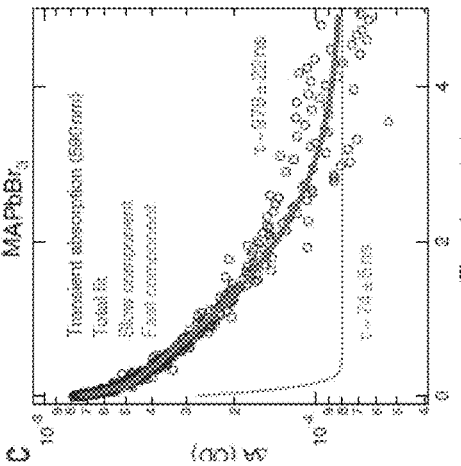
Fig. 2.3A
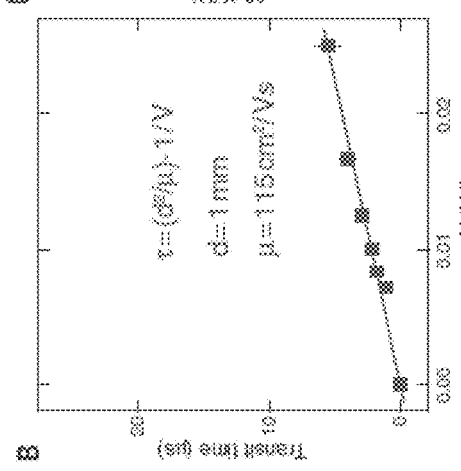
Fig. 2.3B
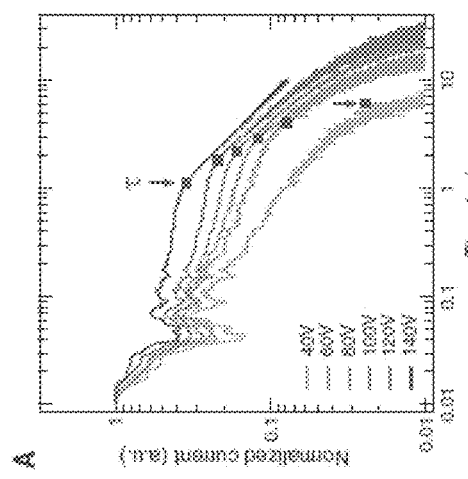
Fig. 2.3C
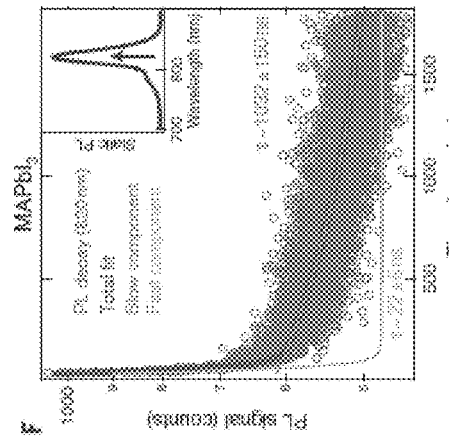
Fig. 2.3D
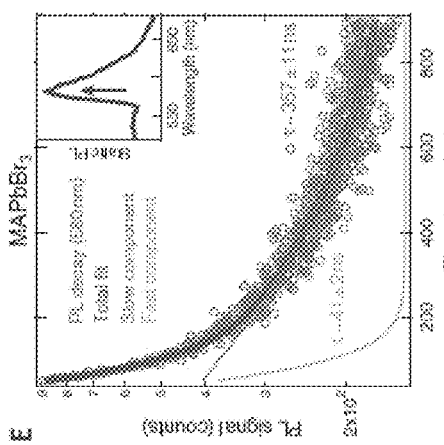
Fig. 2.3E
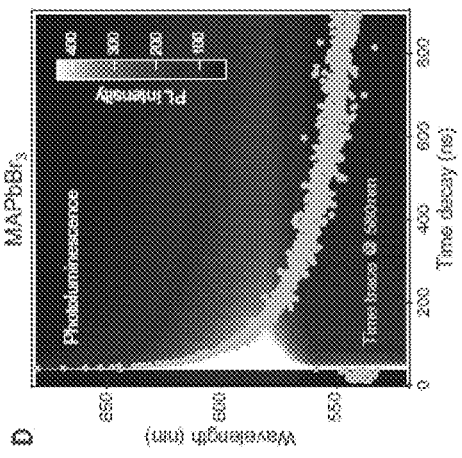
Fig. 2.3F

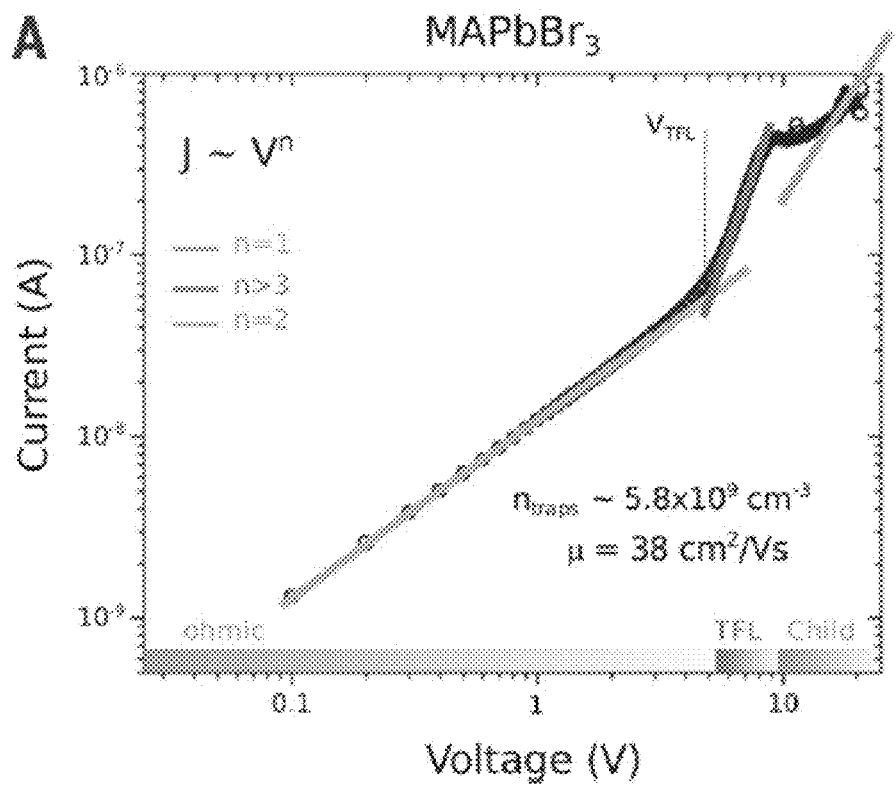
Fig. 2.4A
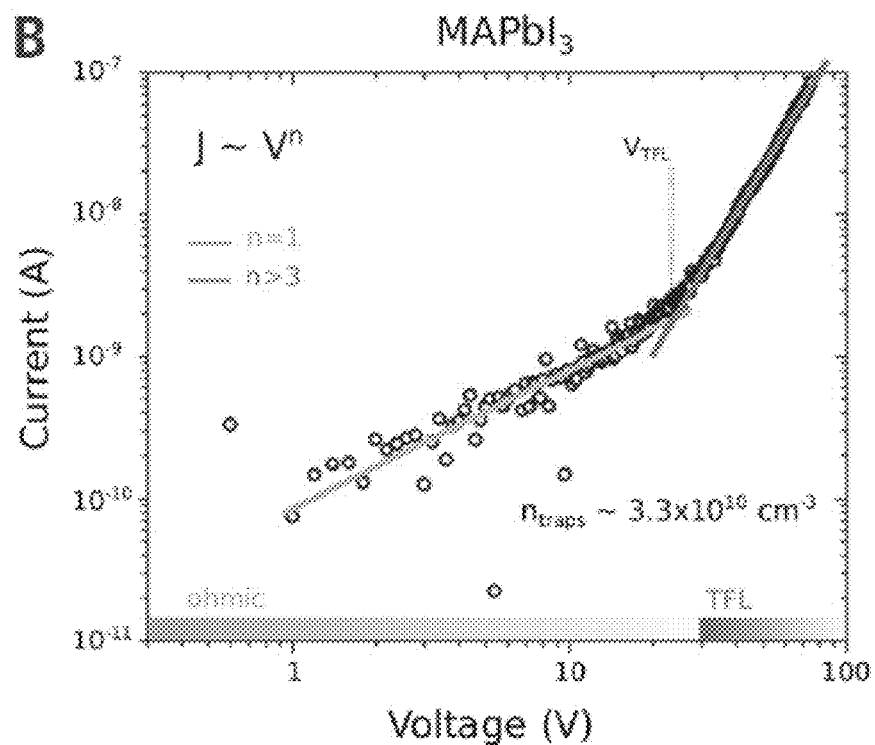
Fig. 2.4B

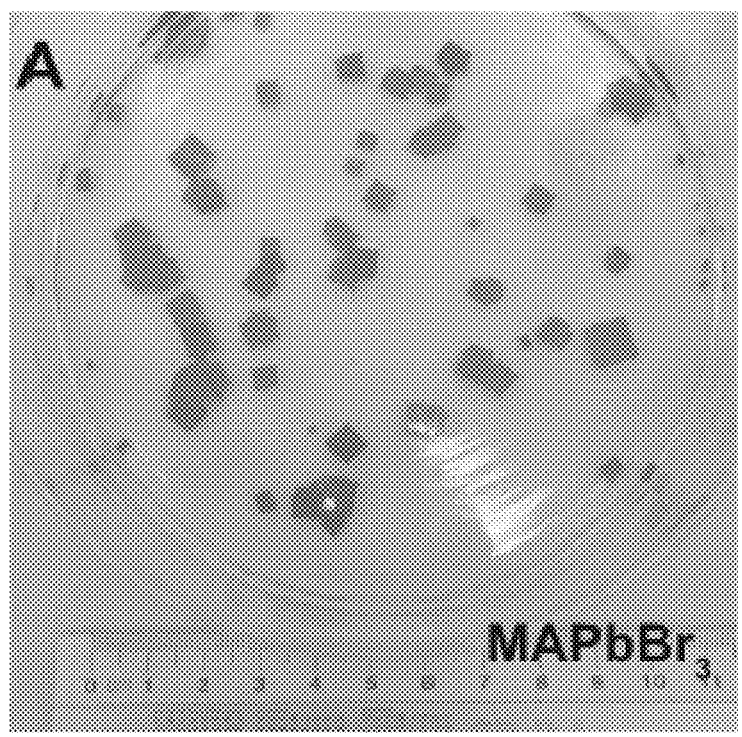
Fig. 2.5A
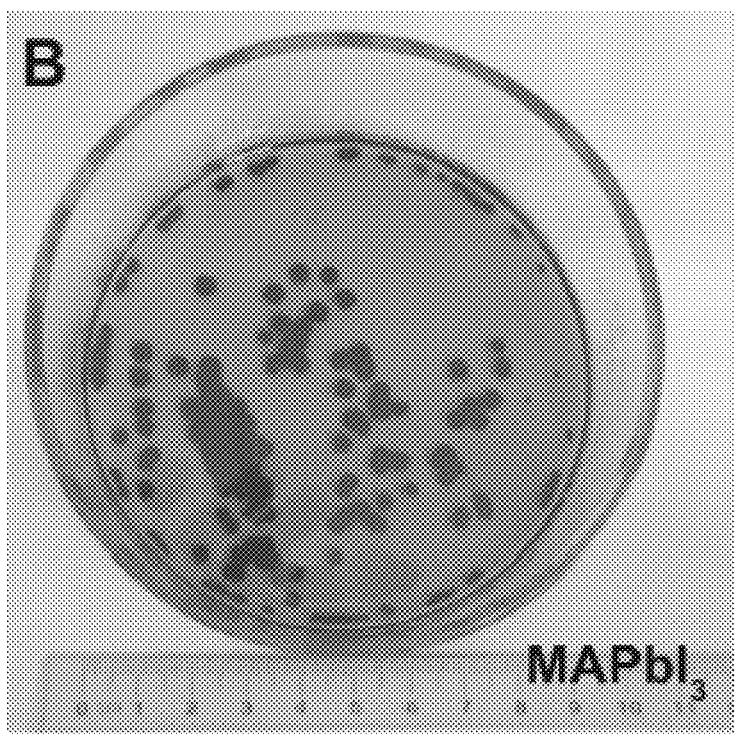
Fig. 2.5B

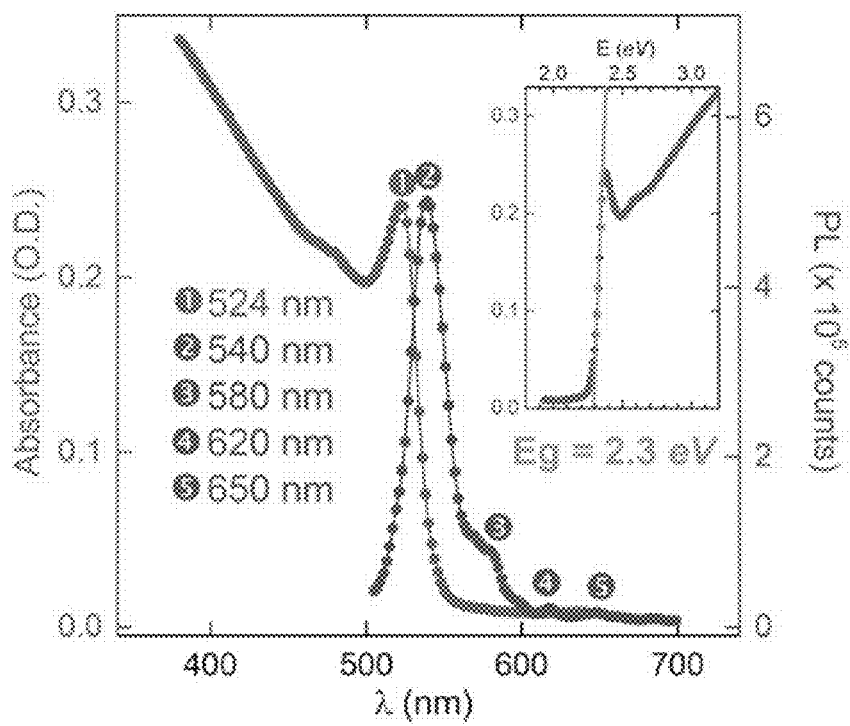
Fig. 2.6
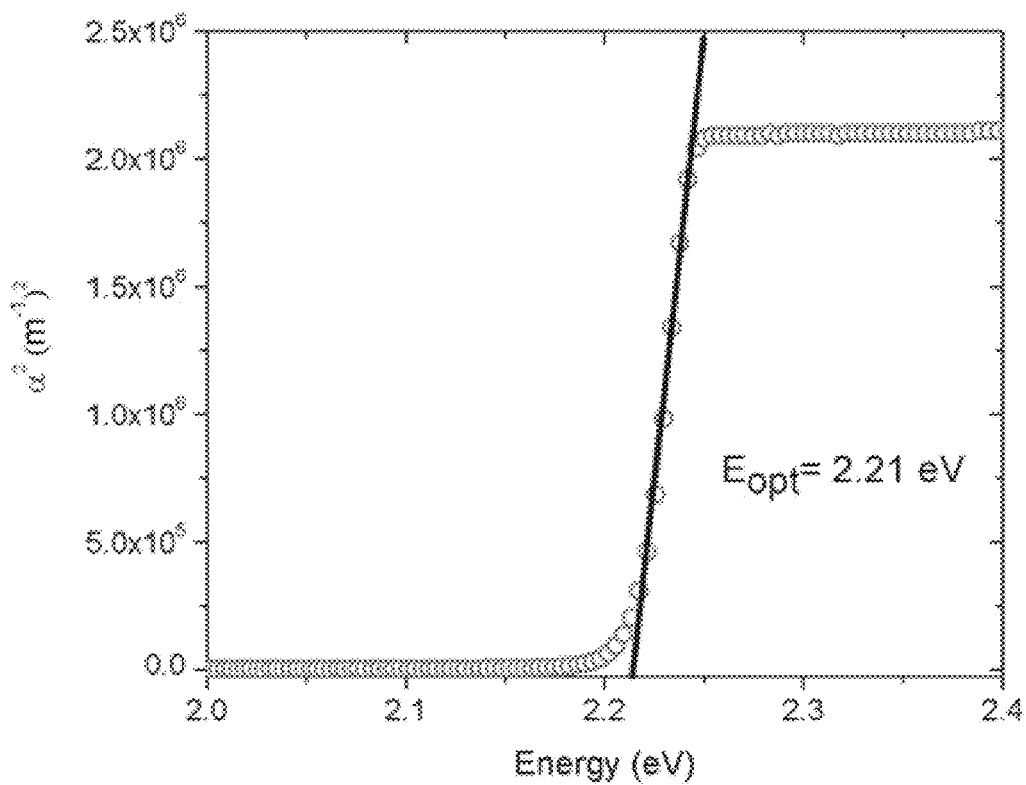
Fig. 2.7

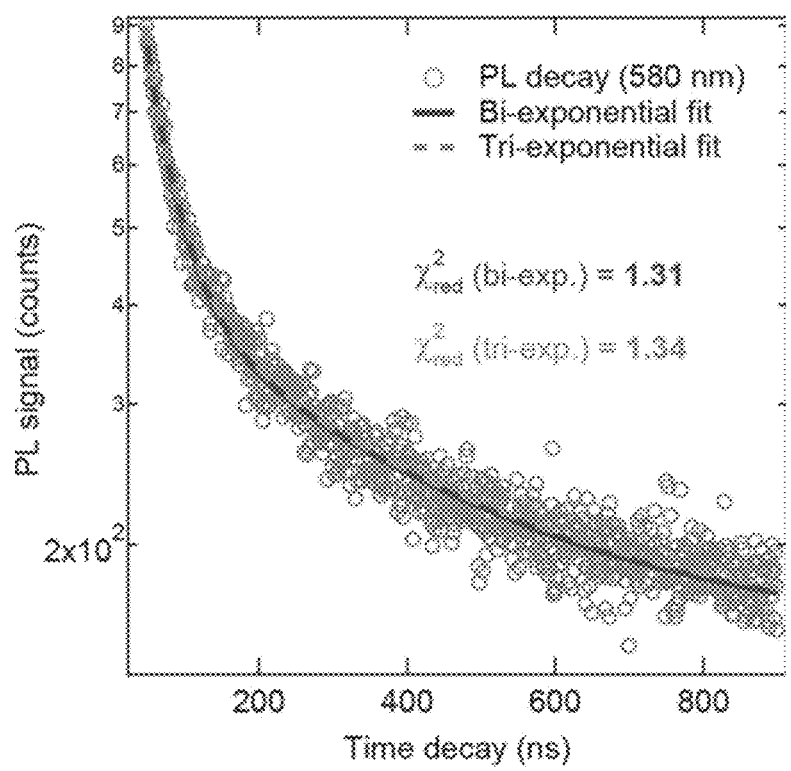
Fig. 2.8
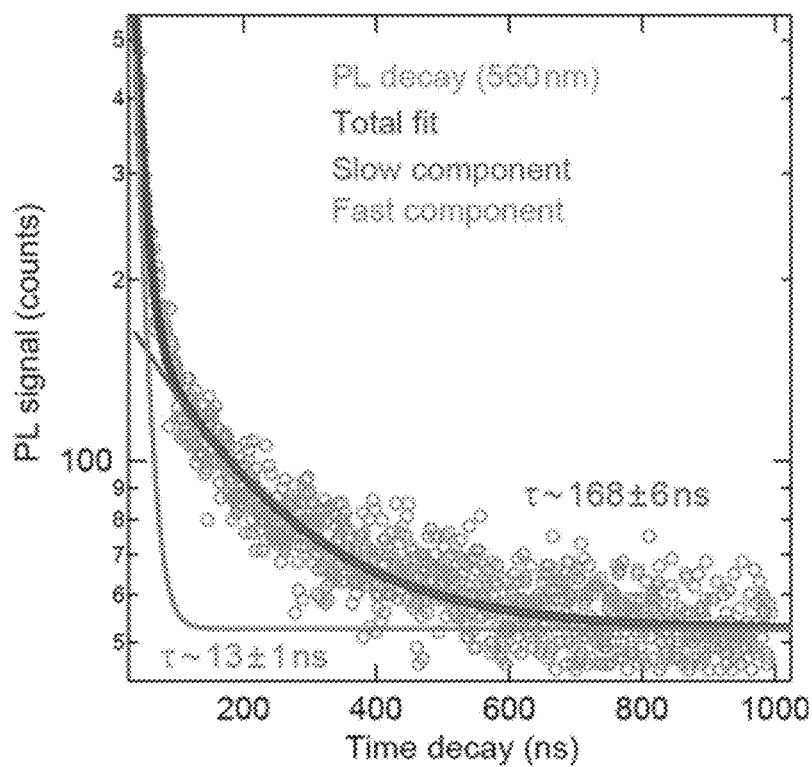
Fig. 2.9

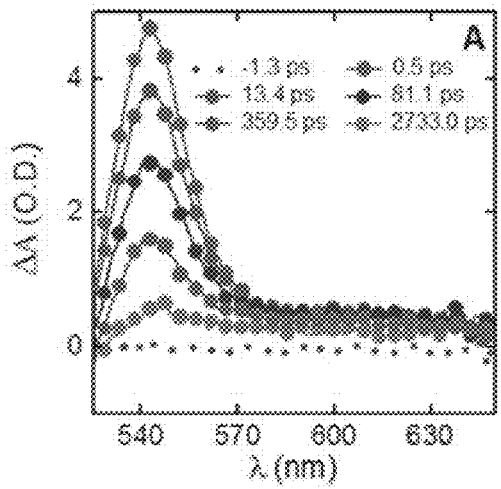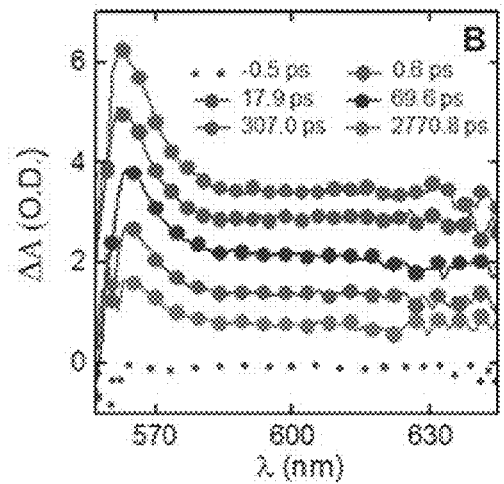
Fig. 2.10A        Fig. 2.10B
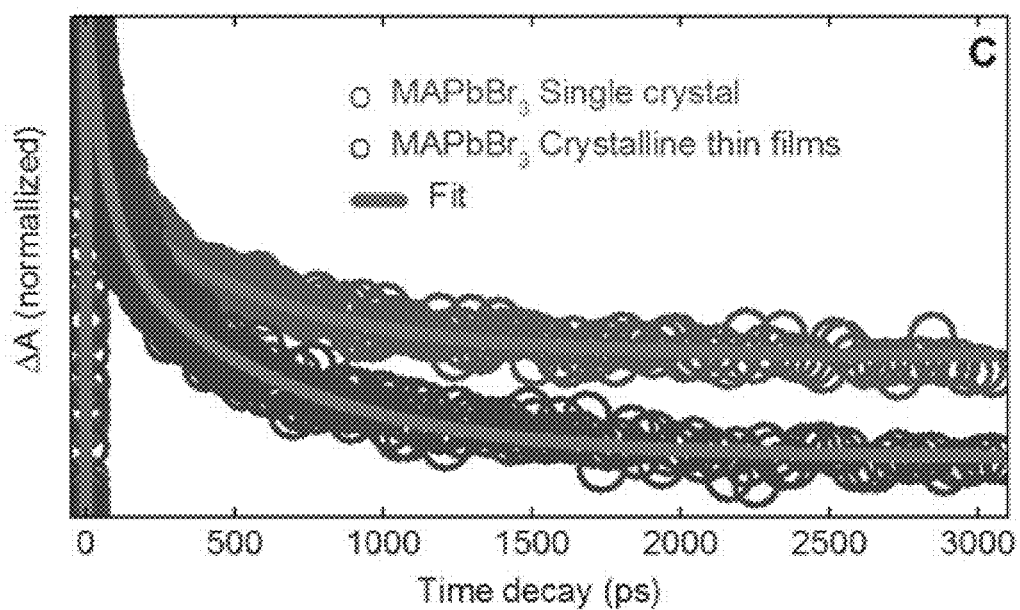
Fig. 2.10C

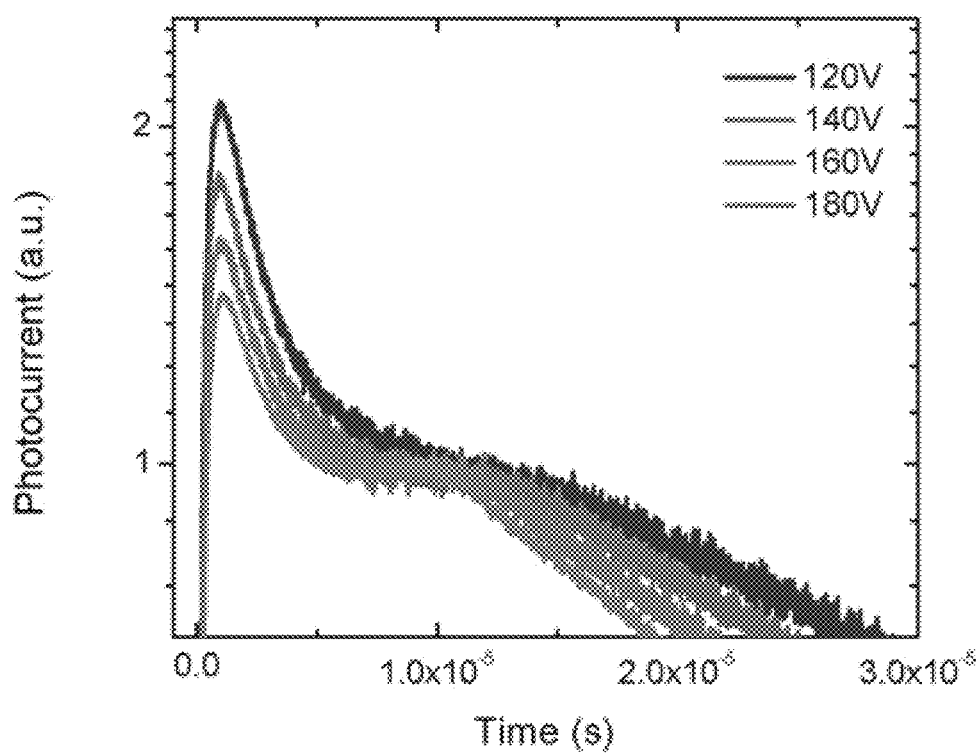
Fig. 2.11A
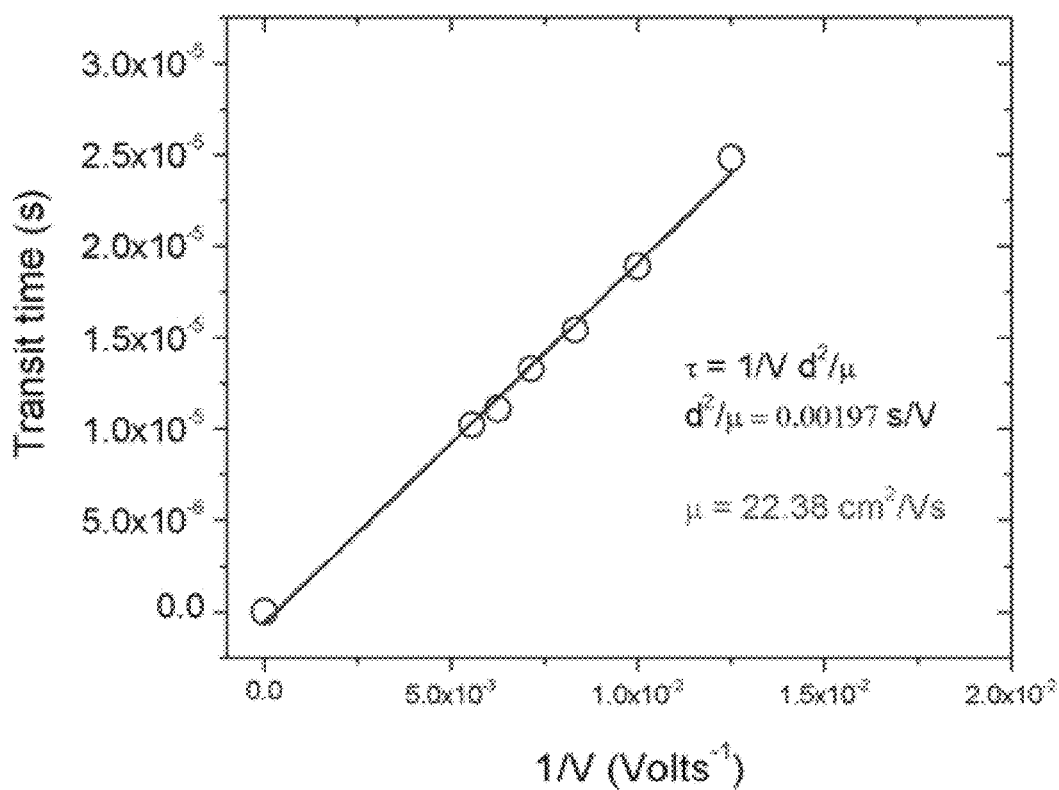
Fig. 2.11B

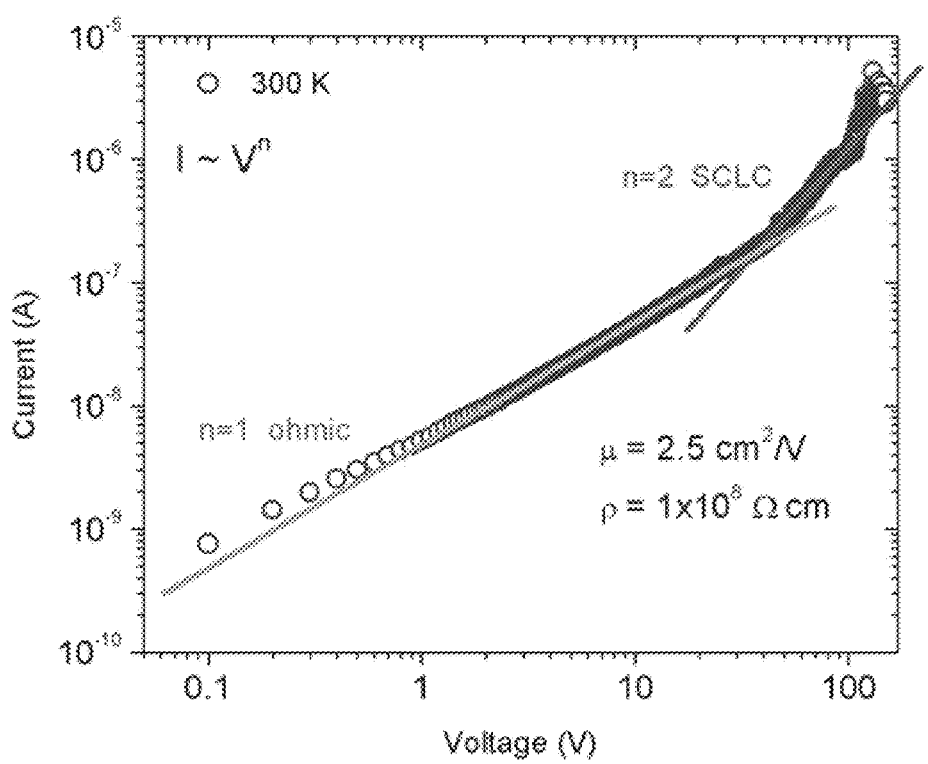
Fig. 2.12
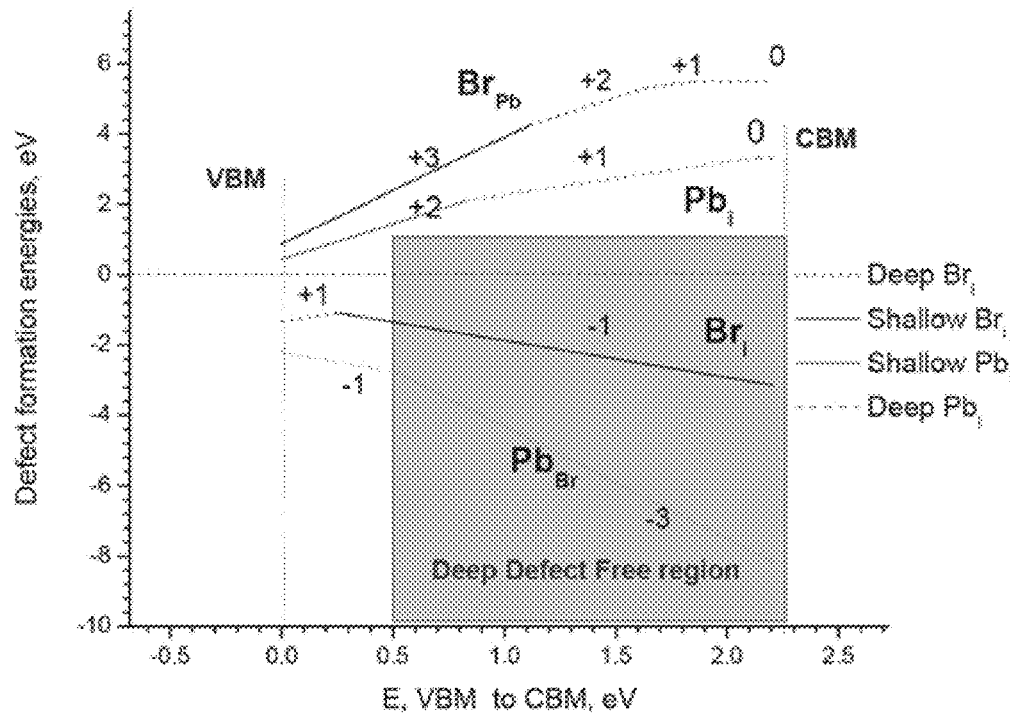
Fig. 2.13

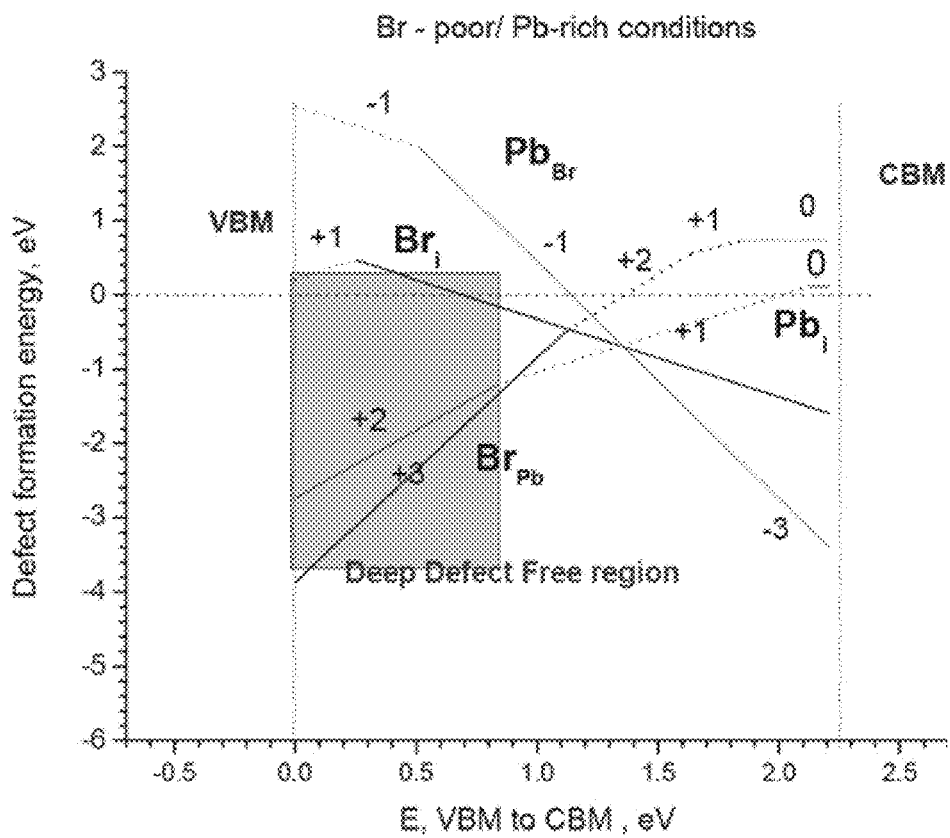
Fig. 2.14
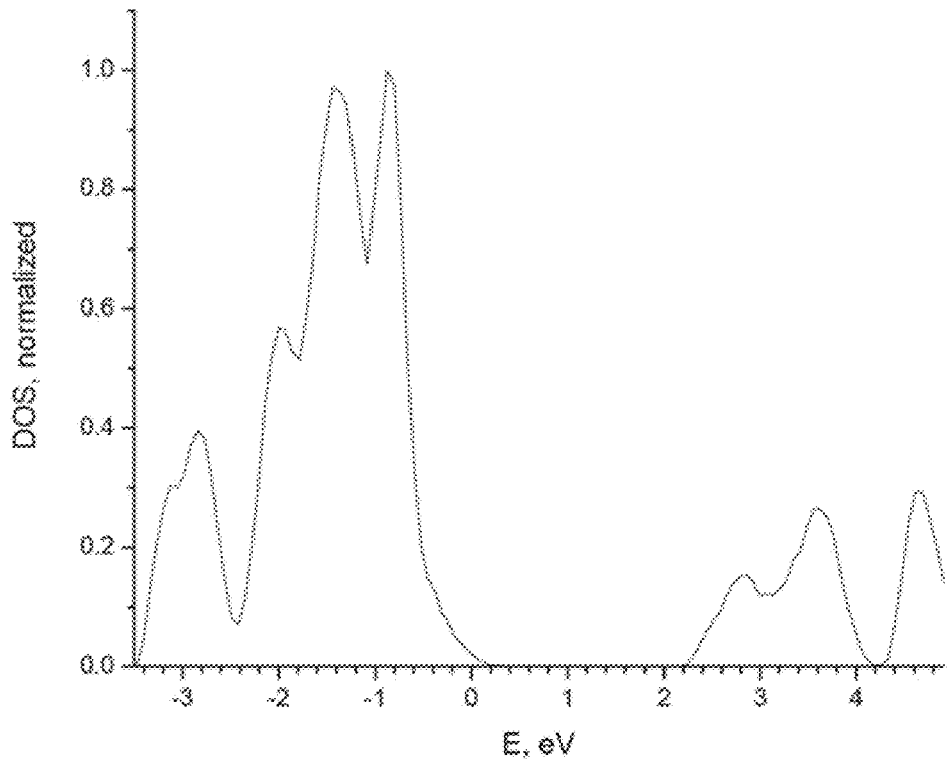
Fig. 2.15

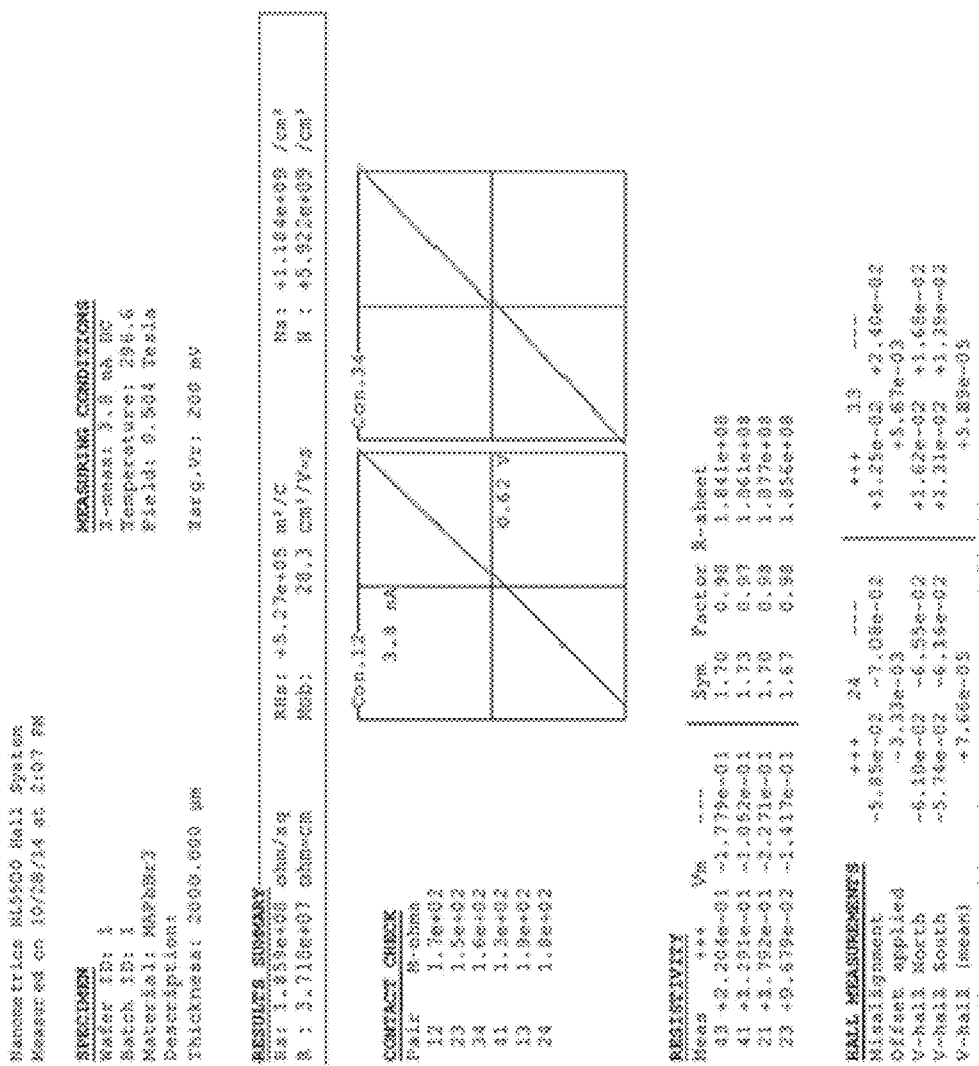
Fig. 2.16

ORGANOMETALLIC HALIDE PEROVSKITE SINGLE CRYSTALS HAVING LOW DEFECT DENSITY AND METHODS OF PREPARATION THEREOF

CROSS-REFERENCE TO RELATED APPLICATION

This application is the National Stage of International Application No. PCT/IB2015/001502, filed 12 Aug. 2015, which claims the benefit of and priority to U.S. Provisional Application Ser. No. 62/037,270, having the title "ORGANOMETALLIC HALIDE PEROVSKITE SINGLE CRYSTALS HAVING LOW DEFFECT DENSITY AND METHODS OF PREPARATION THEREOF," filed on 14 Aug. 2014, the entire disclosures of which are incorporated by reference in their entireties as if fully set forth herein.

BACKGROUND

Solution-processed hybrid organolead trihalide (MAPbX$_3$) perovskite solar cells (PSCs) have now achieved 20.1% certified power conversion efficiencies (PCE), following a rapid surge of development since perovskite-based devices were reported in 2009. A key to the success of PSCs is the long diffusion length of charge carriers in the absorber perovskite layer. This parameter is expected to depend strongly on film crystallinity and morphology, so it is expected that there may be room to improve upon already remarkable PSC efficiencies via the optimization of three key parameters: charge carrier lifetime, mobility, and diffusion length.

SUMMARY

Embodiments of the present disclosure provide for single crystal organometallic halide perovskites, methods of making, methods of use, devices incorporating single crystal organometallic halide perovskites, and the like.

An embodiment of the present disclosure provides for a method of making a single crystal, among others, that includes: providing a first reservoir including a first liquid, and a second reservoir including a second liquid, wherein the first reservoir and second reservoir are separated by a boundary so that the first liquid and the second liquid do not contact one another, wherein the first reservoir and the second reservoir are in a closed system; allowing for vapor diffusion of the second liquid into the first liquid to form a modified first liquid; and precipitating out an organometallic halide perovskite single crystal in the first reservoir.

In an embodiment, the organometallic halide perovskite single crystal has the following formula: AMX$_3$, wherein A is an organic cation, M is selected from the group consisting of: Pb, Sn, Cu, Ni, Co, Fe, Mn, Pd, Cd, Ge, or Eu, and X is a halide. In particular, the organometallic halide perovskite single crystal can be: methylammonium lead chloride (MAPbCl$_3$), methylammonium lead iodide (MAPbI$_3$), methylammonium lead bromide (MAPbBr$_3$), formamidinium lead chloride (FAPbCl$_3$), formamidinum lead bromide (FAPbBr$_3$), formamidinum lead iodide (FAPbI$_3$), methylammonium tin chloride (MASnCl$_3$), methylammonium tin bromide (MASnBr$_3$), methylammonium tin iodide (MASnI$_3$), formamidinium tin chloride (FASnCl$_3$), formamidinium tin bromide (FASnBr$_3$), and formamidinium tin iodide (FASnI$_3$).

An embodiment of the present disclosure provides for a composition, among others, that includes: a single crystal organometallic halide perovskite having a first dimension of about 1 mm to 8 mm and a thickness of about 0.2 to 2 mm, wherein the organometallic halide perovskite single crystal has the following formula: AMX$_3$, wherein A is an organic cation, M is selected from the group consisting of: Pb, Sn, Cu, Ni, Co, Fe, Mn, Pd, Cd, Ge, or Eu, and X is a halide. In an embodiment, the single crystal organometallic halide perovskite has a trap-state density of about $1\times10^{10}$ cm$^{-3}$ to $2\times10^{10}$ cm$^{-3}$, wherein the single crystal organometallic halide perovskite has a long charge-carrier diffusion length of about 16 to 18 µm.

An embodiment of the present disclosure provides for a solar cell, among others, that includes: a single crystal organometallic halide perovskite having a first dimension of about 1 mm to 8 mm and a thickness of about 0.2 to 2 mm, wherein the organometallic halide perovskite single crystal has the following formula: AMX$_3$, wherein A is an organic cation, M is selected from the group consisting of: Pb, Sn, Cu, Ni, Co, Fe, Mn, Pd, Cd, Ge, or Eu, and X is a halide, wherein the single crystal organometallic halide perovskite has a trap-state density of about $1\times10^{10}$ cm$^{-3}$ to $2\times10^{10}$ cm$^{-3}$, wherein the single crystal organometallic halide perovskite has a long charge-carrier diffusion length of about 16 to 18 µm.

Other compositions, systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 1.1A-D illustrate a schematic diagram of the crystallization process. (FIG. 1.1B) Photographic images of the as-grown MAPbBr$_3$ single-crystals. (FIG. 1.1C) Refined single-crystal structure of the as-grown MAPbBr$_3$ crystals. (FIG. 1.1D) Experimental and calculated powder XRD profile of the as-grown MAPbBr$_3$ crystals, confirming 100% phase (cubic) purity. Zoom-in view of experimental (300) diffraction was inserted.

FIGS. 1.2A-B illustrate normalized absorption and PL spectra: FIG. 1.2A) illustrates MAPbBr$_3$ single-crystal in mother liquor; FIG. 1.2B) illustrates crystalline MAPbBr$_3$ thin films. The PL was recorded at excitation wavelength of 480 nm for each case. Insets in FIG. 1.2A) illustrate photographs of the as-grown single-crystals.

FIGS. 1.3A-E illustrate carrier mobility and lifetime measurements. (FIG. 1.3A) Time-of-flight traces showing the transient current I(t) following photoexcitation at time t=0 in a bi-logarithmic plot; the transit time $\tau_t$ is identified by the corner in each trace and marked using the blue squares. Inset: transit time vs. inverse voltage V$^{-1}$. (FIG. 1.3B) Mobility (red circles) and transit time (blue squares) vs. driving voltage, with different estimates of the mobility provided. (FIG. 1.3C) Time- and wavelength-dependent photoluminescence (PL) color map $I_{PL}(t, \lambda)$, with superimposed the time trace at $\lambda$=580 nm and the impulsive background signal at short times (full grey). (FIG. 1.3D) Time-averaged PL as a function of wavelength for different time ranges. (FIG. 1.3E) Background-subtracted PL time decay trace at λ=580 nm on a logarithmic scale, with bi-exponential fits showing a fast (τ~256 ns) and a slow dynamics (τ~833 ns).

FIG. 1.4 illustrates transient absorption spectra of the thin film (top panel) and single-crystal (middle panel) of $MAPbX_3$. In the lower panel is the normalized time profile of transient absorption of the thin film (red dots) and single-crystal (black dots) of $MAPbX_3$ Measured at 440 nm excitation. The solid line is the calculated signal.

FIG. 1.5 illustrates the Current-Voltage trace and trap density. Characteristic current (I) vs. voltage (V) trace (purple markers) showing three different regimes: (i) Ohmic (0.1-3 V), with linear voltage dependence (I~V, blue line); (ii) trap-filled limit (TFL, 3-7 V), with a steep power-like increase in current (I~$V^{8.9}$, green line); (iii) space-charge-limited-current (SCLC, >7 V), which is quadratic with the applied voltage (I~$V^2$, gold line).

FIG. 1.6 illustrates a photograph of a batch of the as-grown $MAPbBr_3$ single-crystals obtained within one week using the method detailed in the text.

FIG. 1.7 illustrates a PES (left, showing valence band structures) and IPES (right, showing conduction band structures) spectra of $MAPbBr_3$ single-crystal.

FIG. 1.8 illustrates a time- and wavelength-dependent photoluminescence (PL) color map $I_{PL}(t, \lambda)$, with superimposed the time trace at λ=560 nm and the impulsive background signal at short times.

FIG. 1.9 illustrates photographs of the as-grown $MAPbI_3$ single-crystals at room temperature.

FIGS. 2.1A-B illustrate crystal growth and diffraction. (FIG. 2.1A) Schematic diagram of the crystallization process. (FIG. 2.1B) Experimental and calculated powder XRD profiles confirming the phase purity of the room-temperature grown $MAPbX_3$ crystals. Single crystal XRD data are given in SM.

FIGS. 2.2A-B illustrate steady state absorbance and photoluminescence. (FIG. 2.2A) $MAPbBr_3$ single crystal. (FIG. 2.2B) $MAPbI_3$ single crystal. Insets: absorbance vs. photon energy and determination of band gap. PL excitation wavelength was 480 nm.

FIGS. 2.3A-F illustrate carrier mobility and lifetime measurements. (FIG. 2.3A) Time-of-flight traces showing the transient current (t) following photoexcitation at time t=0 in a bilogarithmic plot; the transit time τt is identified by the corner in each trace and marked using the blue squares. (FIG. 2.3B) Linear fit of the transit time vs. inverse voltage $V^{-1}$. (FIG. 2.3C) Transient absorption in $MAPbBr_3$ crystals, evaluated at 590 nn, showing a fast component (τ~74±5 ns) together with a slower decay (τ~978±22 ns). (FIG. 2.3D) Time- and wavelength-dependent photoluminescence (PL) color map (t,), with superimposed the time trace at λ=580 nm (blue markers). (FIG. 2.3E) PL time decay trace on a $MAPbBr_3$ crystals at λ=580 nm, with bi-exponential fits showing a fast (τ~41±2 ns) and a slow dynamics (τ~357±11 ns). (FIG. 2.3F) PL time decay trace on a $MAPbI_3$ crystals (λ=820 nm, also showing a fast (τ~22±6 ns) and a slow (τ~1032±150 ns) component.

FIGS. 2.4A-B illustrate Current-Voltage traces and trap density. Characteristic current (I) vs. voltage (V) trace (purple markers) showing three different regimes for (FIG. 2.4A) MAPbBr3 (at 300K) and (FIG. 2.4AB) MAPbI3 (at 225 K). A linear ohmic regime (I~V, blue line) is followed by the trap-filled regime, marked by a steep increase in current (I~$V^{n>3}$, green line). The MAPbBr3 trace shows a trap-free Child's regime (I~$V^2$, green line) at high voltages.

FIGS. 2.5A-B illustrate photograph of a batch of the as-grown $MAPbBr_3$ (FIG. 2.5A) and $MAPbI_3$ (FIG. 2.5B) single crystals obtained within one week.

FIG. 2.6 illustrates static absorbance and PL spectrum of $MAPbI_3$ thin films. Excitation wavelength of 480 nm was used to record the PL. The main peak occurring at 540 nm in thin films may stem from the low-dimensional structurally coherent units within the $MAPbBr_3$ film, whereas the noticeable peak at longer wavelength around 580 nm may be attributed to the intrinsic PL of the fully crystallized three-dimensional $MAPbBr_3$ lattice which is less tight in thin films than in single crystals. Other PL signals appearing around 620 nm and 650 nm may originate from sub gap trap states (43).

FIG. 2.7 illustrates the extraction of the optical band gap of $MAPbBr_3$ single crystal. The optical bandgap is extracted by using the relation:

$$\alpha = c(hf - E_g)^{1/2} \quad (44)$$

Where hf is the photon energy, a is the optical absorption coefficient, $E_g$ the energy bandgap and c a constant of the material. The exponent 1/2 in the right side of the equation applies for direct bandgap semiconductors. The measured bandgap, 2.21 eV, is in good agreement with the DFT computed value (2.2 eV) shown in FIG. 2.15.

FIG. 2.8 illustrates the model comparison for the analysis of the PL decay time traces on a $MAPbBr_3$ single crystalline sample. Overlaid on top of the experimental PL decay trace (grey markers, same as FIG. 2.3) are plotted the bi-exponential (blue) and tri-exponential (green) fit profiles. The values of the reduced chi-square $\chi_{red}^2$ for the two models are also reported, demonstrating that a tri-exponential model does not perform better than a bi-exponential one.

FIG. 2.9 illustrates time-resolved PL of $MAPbBr_3$ thin films, acquired at λ=560 nm, showing the experimental time trace (grey markers) with bi-exponential fit (continuous lines) and corresponding time constants superimposed.

FIGS. 2.10A-C illustrate transient absorption spectra. Transient absorption spectra of the thin film (FIG. 2.10A) and single crystal (FIG. 2.10B) of $MAPbBr_3$. (FIG. 2.10C) The normalized time profile of transient absorption of the thin film (red dots) and single crystal (black dots) of $MAPbBr_3$ Measured at 480 nm excitation. The solid line is the calculated signal. As can be clearly seen in FIG. 2.10, under the same experimental conditions, the decay of the excited state due to the electron hole recombination of single crystals is much longer than the thin film (FIG. 2.10C). The observed decay can be attributed to trap-assisted recombination of charge carriers, indicating that substantially fewer defect trap-states are present in the single crystal relative to the thin film. This finding is consistent with the long carrier lifetimes extracted from photoluminescence experiments on single crystals.

FIG. 2.11A illustrates time of flight measurements of $MAPbBr_3$, while FIG. 2.11B illustrates the lower mobility, which are shown for completeness. A small variability between the samples is seen.

FIG. 2.12 illustrates the space charge limited current analysis for a $MAPbI_3$ single crystal of dimensions: 1.63 mm×2.74 mm×2.74 mm.

FIG. 2.13 illustrates the defect formation energies in case of Br-rich growth conditions. No vacancies are displayed due to their shallow nature.

FIG. 2.14 illustrates the defect formation energies in case of Br-poor growth conditions. No vacancies are displayed due to their shallow nature.

FIG. 2.15 illustrates the MAPbBr$_3$ Density of States (DOS).

FIG. 2.16 illustrates the Hall effect results.

DETAILED DESCRIPTION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, material science, synthetic organic chemistry, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 0° C. and 1 bar.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

General Discussion

Embodiments of the present disclosure provide for single crystal organometallic halide perovskites, methods of making, methods of use, devices incorporating single crystal organometallic halide perovskites, and the like. Embodiments of the present disclosure provide for methods of making single crystal organometallic halide perovskites that is simple and requires little or no energy input. In addition, other methods can not be used to form single crystal organometallic halide perovskites having dimensions at the micron-scale level.

Furthermore, single crystal organometallic halide perovskites formed using embodiments of the present disclosure can have superior characteristics as compared to state-of-the-art crystalline thin films prepared by other methods and these characteristic can include charge carrier mobility, lifetime, trap-state density, and/or diffusion length. In this regard, embodiments of the single crystal organometallic halide perovskite can be used in photovoltaic devices such as perovskite-type photovoltaic devices, where superior properties of the single crystal organometallic halide perovskite can be used to achieve enhanced photocurrent generation, collection, and overall power conversion efficiency.

Embodiments of the present disclosure provide for single crystal organometallic halide perovskites. In an embodiment, the organometallic halide perovskite single crystal can have the following formula: AMX$_3$. In an embodiment, A can be an organic cation such as alkyl-ammonium (e.g., methylammonium (MA)), formamidinum (FA), 5-ammoniumvaleric acid. In an embodiment, M can be a cation or divalent cation of an element such as Pb, Sn, Cu, Ni, Co, Fe, Mn, Pd, Cd, Ge, or Eu. In an embodiment, X can be a halide such as Cl, Br, F, I, and At. The selection of the components of AMX$_3$ is made so that the organometallic halide perovskite has a neutral charge. In an embodiment, alkyl can refer to hydrocarbon moieties having one to six carbon atoms, linear or branched, substituted or substituted (e.g., a halogen).

In an embodiment, AMX$_3$ can be: methylammonium lead chloride (MAPbCl$_3$), methylammonium lead iodide (MAPbI$_3$), methylammonium lead bromide (MAPbBr$_3$), formamidinium lead chloride (FAPbCl$_3$), formamidinum lead bromide (FAPbBr$_3$), formamidinum lead iodide (FAPbI$_3$), methylammonium tin chloride (MASnCl$_3$), methylammonium tin bromide (MASnBr$_3$), methylammonium tin iodide (MASnI$_3$), formamidinium tin chloride (FASnCl$_3$), formamidinium tin bromide (FASnBr$_3$), or formamidinium tin iodide (FASnI$_3$).

Single crystal organometallic halide perovskites having a dimension greater than the micron range have not been previously formed due to limitations in the known processes from making them. In an embodiment, the single crystal organometallic halide perovskite can have dimensions greater than 500 microns (e.g., about 500 microns to 10,000 microns or about 500 microns to 5000 microns) or greater than 1000 microns (e.g., about 1000 microns to 10,000 microns or about 1000 microns to 5000 microns). In an embodiment, the single crystal organometallic halide perovskite can have one or more dimensions of about 0.1 mm to 10 mm or more. In an embodiment, the single crystal organometallic halide perovskite can have the following dimensions: one or more dimensions (e.g., length, width, diameter) of about 1 mm to 10 mm and a thickness of about 0.05 to 3 mm. In an embodiment, the single crystal organometallic halide perovskite can have a crustal volume of 100 mm$^3$ or more. In an embodiment, the single crystal organometallic halide perovskite can have the following dimensions: a length of about 1 mm to 10 mm or about 2 mm to 8 mm, a width of about 1 mm to 10 mm or about 2 mm to 8 mm and a thickness of about 0.2 to 2 mm.

Embodiments of the single crystal organometallic halide perovskite can have one or more of the following characteristics: larger charge carrier mobility than state-of-the-art crystalline thin films prepared by other methods, larger lifetime than state-of-the-art crystalline thin films prepared by other methods, larger trap-state density than state-of-the-art crystalline thin films prepared by other methods, or longer diffusion length than state-of-the-art crystalline thin films prepared by other methods.

In an embodiment, the charge carrier mobility can be an order of magnitude larger than state-of-the-art crystalline thin films. In an embodiment, the charge carrier mobility can be about 70 to 150 cm$^2$/Vs for MAPbBr$_3$. In an embodiment, the expected charge carrier mobility may be about 40 to 100 cm$^2$/Vs for MAPbCl$_3$. In an embodiment, the expected charge carrier mobility may be about 100 to 220 cm$^2$/Vs for MAPbI$_3$.

In an embodiment, the lifetime can be an order of magnitude larger than state-of-the-art crystalline thin films. In an embodiment, the lifetime can be about 150 to 750 ns for MAPbBr$_3$. In an embodiment, the expected lifetime may be about 100 to 450 ns for MAPbCl$_3$. In an embodiment, the expected lifetime may be about 300 to 1000 ns for MAPbI$_3$.

In an embodiment, the trap-state density can be an order of magnitude larger than state-of-the-art crystalline thin films. In an embodiment, the trap-state density can be about 1×10$^{10}$ cm$^{-3}$ to 3×10$^{10}$ cm$^{-3}$ for MAPbBr$_3$. In an embodiment, the expected trap-state density may be about 1×10$^{13}$ cm$^{-3}$ to 3×10$^{13}$ cm$^{-3}$ for MAPbCl$_3$. In an embodiment, the expected trap-state density may be about 1×10$^{13}$ cm$^{-3}$ to 3×10$^{10}$ cm$^{-3}$ for MAPbI$_3$.

In an embodiment, the charge-carrier diffusion length can be an order of magnitude larger than state-of-the-art crystalline thin films. In an embodiment, the charge-carrier diffusion length can be about 7 to 17 μm for MAPbBr$_3$. In an embodiment, the expected charge-carrier diffusion length may be about 1 to 10 μm for MAPbCl$_3$. In an embodiment, the expected charge-carrier diffusion length may be about 10 to 30 μm for MAPbI$_3$.

An embodiment of the present disclosure includes a method of making a single crystal, in particular organometallic halide perovskite single crystals as described herein. The method is simple, the component set up is not complex and does not require specialized equipment, the time of reaction is relatively time-efficient, and the reaction requires no-energy input.

An embodiment of the present disclosure includes a first reservoir and a second reservoir, each including a liquid (e.g., a first liquid and second liquid, respectively). In an embodiment, the first liquid can include a first liquid solvent, a first precursor, and an organic cation precursor. In an embodiment, the first liquid solvent can be N,N-dimethylformamide (DMF), dimethylsulfoxide (DMSO), gamma-butyrolactone (GBR), or a combination thereof.

In an embodiment, the first precursor can be a compound that supplies M for the organometallic halide perovskite single crystal (AMX$_3$), where M is defined herein. In an embodiment, the first precursor can be a halide salt of M, for example PbBr$_2$ or SnBr$_2$. In an embodiment, the concentration of the first precursor in the first liquid can be about 1 to 20 weight %.

In an embodiment, the organic cation precursor can be a compound that supplies A for the organometallic halide perovskite single crystal (AMX$_3$), where A is defined herein. In an embodiment, the organic cation precursor can be a halide salt of A. In an embodiment, the organic cation precursor can be methylammonium bromide, methylammonium iodide, methylammonium chloride, formamidinium chloride, formamidinium bromide, or formamidinium iodide. In an embodiment, the concentration of the organic cation precursor in the first liquid can be about 1 to 30 weight %.

In an embodiment, the second liquid can be a second liquid solvent that has a boiling point that is less (e.g., about 70° C. or more) than that of the first liquid solvent and is not a solvent for the first precursor or organic cation precursor. In an embodiment, the second liquid solvent can be: dichloromethane, chloroform, acetonitrile, toluene, or a combination thereof.

In an embodiment, the first reservoir and second reservoir are separated by a boundary so that the first liquid and the second liquid do not contact one another. In an embodiment, the first reservoir is positioned in the center of second reservoir with a boundary wall separating the first liquid and the second liquid. Other configurations can be used that include a plurality of first reservoirs and a plurality of second reservoirs as long as the first liquid and the second liquid are separated.

In an embodiment, the first reservoir and the second reservoir can be a single structure or can be separate structures. In an embodiment, the first reservoir and the second reservoir can be made of materials that do not impede the formation of the organometallic halide perovskite single crystals, for example, metal, plastic, glass, and the like. In an embodiment, the first reservoir and the second reservoir can have dimensions on the millimeter scale to the centimeter scale or larger as needed. The shape of the first reservoir and the second reservoir can be constructed to control the rate formation of organometallic halide perovskite single crystals, dimensions of the organometallic halide perovskite single crystals, and the like.

The first reservoir and second reservoir are enclosed by a structure(s) to form a closed system. In an embodiment, the structure can be designed to reduce or eliminate exposure of the first liquid and the second liquid to light. In an embodiment, the structure can be used to reduce or prevent exposure of the first liquid and the second liquid to contaminants. In an embodiment the structure can be configured to control the temperature and/or pressure to which the first and second liquids are subjected. In general, the temperature is room temperature and the pressure is 1 atm, however, the structure can include equipment (e.g. pumps, pressure gauges, heating devices, cooling device, and the like) to adjust the temperature and/or pressure to control the rate of formation of the organometallic halide perovskite single crystals, the size of the organometallic halide perovskite single crystals, and the like. In an embodiment, the structure can be made of materials that do not impede the formation of the organometallic halide perovskite single crystals for example, metal, plastic, glass, and the like.

Now referring to the method, initially the first liquid and the second liquid are disposed in the first reservoir and second reservoir, respectively. In an embodiment, the second liquid solvent vaporizes more readily than the first liquid solvent, so that the second liquid solvent diffuses into the first liquid over time (e.g., hours to days) to form a modified first liquid. Typically, the vaporization is allowed to occur at room temperature and pressure. In other embodiments, the temperature and/or pressure can be adjusted to control the rate of formation of the organometallic halide perovskite single crystals.

Since the first precursor and the organic cation precursor are not soluble or only slightly soluble in the second liquid solvent, the first precursor and the organic cation precursor precipitate (e.g., stoichiometrically precipitate) from the modified first liquid as the second liquid solvent diffuses into the first liquid. In an embodiment, the diffusion rate can be controlled by selection of the first liquid solvent, the second liquid solvent, the temperature, and pressure. In a particular embodiment, the diffusion rate can be controlled by selection of the first liquid solvent and the second liquid solvent. After a time frame, the organometallic halide perovskite single crystals are formed. In an embodiment, the time frame can be about a few hours to about fourteen days or about a day to a about seven days.

In an embodiment, the single crystal organometallic halide perovskite can be used in a solar cell. Use of single crystal organometallic halide perovskites of the present disclosure in a solar cell can lead to enhanced photocurrent generation and/or collection or the overall power conversion efficiency upon use in photovoltaic devices.

EXAMPLES

Now having described the embodiments of the disclosure, in general, the examples describe some additional embodiments. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Example 1

Brief Introduction:

Despite the staggering advances in the efficiency of solar cells based on methylammonium lead trihalide ($MAPbX_3$) perovskites within the past two years, the perovskites' fundamental properties and ultimate performance limits remain obscured by the extensive disorder in crystalline $MAPbX_3$ films. Researchers have thus far relied on such films for their studies because of the difficulty in growing appropriately sized $MAPbX_3$ single-crystals. Here we show a simple room-temperature vapor diffusion-assisted route to obtain sizable crack-free $MAPbX_3$ single-crystal wafers (up to 8×8×2 mm). Only by reaching such scales did it become practical to measure their optical and transport characteristics, which we demonstrate by revealing the exceptionally low (ultra-high-quality crystalline silicon-like) trap-state densities (ca. $1.4 \times 10^{10}$ cm$^{-3}$) and long charge-carrier diffusion-lengths (~16.8 μm) of $MAPbBr_3$ crystals. The room-temperature growth of these well-ordered high-performing semiconductors, suitable for device studies, is a groundbreaking advancement towards realizing the ultimate efficiency of perovskite photovoltaics.

Introduction:

Recent advancements in hybrid organo-lead trihalide perovskite solar cells (PSCs) have made the union between 'low-cost' and 'high-efficiency' suddenly seem within reach. Since the first report of low-cost solution-processed photovoltaics (PVs) incorporating hybrid organo-lead halide perovskites in 2009,[1] the technology has seen a meteoric rise in its power conversion efficiency (PCE).[2,3,4,5,6,7,8,9] To-date certified PCEs of 17.9% have been reached,[10] with a strong expectation that further substantial improvements will be reached before the end of 2014.[10,11,12,13] In contrast, traditional crystalline Si and thin film chalchogenide (e.g., CIGS, CdTe) PVs, the dominant technologies of today, took decades to achieve this benchmark, and yet remain at a substantial cost disadvantage vis-à-vis traditional energy sources due to their expensive fabrication methodologies—such as high-vacuum vapor-assisted deposition methods.

Hybrid organo-lead trihalide perovskites have the crystal structural formula $APbX_3$, where the A-site is occupied by an organic cation (e.g. methylammonium, MA; or formamidinium, FA) and the X-site is occupied by a halide (typically I, Br, and Cl).[14] Key to the success of PSCs is the long charge-carrier diffusion length in the absorber perovskite layer, which is a result of the material's high crystalllinity, despite its low-temperature solution-processability.[15,16,17,18] This property has enabled hybrid PSCs to go through several structural evolutions[2,3,4,5,19,20,21] resulting in a thick perovksite absorber layer sandwiched between planar n-type and p-type layers, without sacrificing charge collection efficiency in the device.

Numerous investigations have focused on the perovskite layer's nanocrystallinity as the crucial factor toward the overall performance and a major avenue for the further improvement of PSCs.[22,23,24] Recently, it was found that improving the crystallinity and homogeneity of perovskite thin films resulted in a dramatic enhancement in the carrier mobility and diffusion length (beyond 1 μm[15]).[17,18] Yet, according to a recent study as well, only ~30% of complete crystallinity was realized inside solution-processed perovskite layers, while the remainder material was comprised of a coherent structure of short-range order.[25] Consequently, the dominating level of disorder in perovksite films prepared using currently available methods makes it difficult to experimentally study and theoretically model the materials system in order to gain key insights into its remarkable efficiency. Promisingly, it also suggests that drastic improvement in the crystallinity and reduction of disorder and defect states in the material will enable PSCs to easily surpass all current or expected PCE benchmarks (~20%) that are set by the existing state of the perovskite layer.[25]

Here we show a straightforward room-temperature solution-based vapor-assisted diffusion crystallization method—inspired by vapor diffusion approaches commonly used by crystallographers to grow high-quality but micron-sized macromolecular single-crystals—[26] to grow appreciable quantities of methylammonium lead bromide ($MAPbBr_3$) semi-transparent square-shaped single-crystal wafers approaching centimeter dimensions. Because these wafers were of high-quality and large enough size for practical experimental measurements as well as device applications, we were able to uncover their remarkable properties: extraordinarily low electronic defect trap-state densities; a sharp absorption band edge; narrow photoluminescence (PL) peak of small stokes shift; and extremely high charge-carrier mobility, lifetime, and diffusion lengths in comparison to the state-of-the-art solution processed crystalline perovskite films. Our findings reveal that single-crystal hybrid perovskites are high-performance optoelectronic grade semiconductors on par with ultra-high-quality crystalline Si (c-Si), which—combined with the simplicity of our growth scheme—provides impetus for PV researchers to pursue device architectures based on completely crystalline perovskites and heralds further breakthroughs for the PSC technology.

Results and Discussions:

With the motivation to obtain sizeable, yet high quality, $MAPbX_3$ single-crystals for practical charge carrier mobility and lifetime characterizations, and steady-state optical and electronic measurements, we devised a vapor diffusion technique, which is here used for the first time in organo-lead halides. The apparatus used for the crystallization is comprised of two simple vials (or crystallizing dishes) as schematically described in FIG. 1.1A. The inner vial (or crystallizing dish) contains a solution of the two precursors MABr and $PbBr_2$ fully dissolved in a solvent with relatively high boiling point such as N,N-dimethylformamide (DMF), while the outer vial (or crystallizing dish) contains a more volatile solvent such as dichloromethane (DCM) which is a non-solvent for the two precursors. Vapor from the outer volatile non-solvent slowly diffuses into the inner solvent at room temperature, gradually decreasing the overall solubility of the two precursors and forcing the product out of the solution in the form of $MAPbBr_3$ crystals. Through the careful selection of solvents and control of the diffusion rate—so that both precursors are precipitated from solution stoichiometrically—large and high quality $MAPbBr_3$ single-crystals were grown in the mixed mother liquid within the inner vial. The crystallization was performed in a closed system and kept in the dark. Within one-week of initiating the crystallization with this method, dozens of high quality cubic $MAPbBr_3$ single-crystals in the shape of square wafers (between ~1 mm×1 mm×0.2 mm and ~8 mm×8 mm×2 mm as shown in FIG. 1.6) formed in the inner crystallizing dish (O.D.×H~125 mm×65 mm). This unattended crystallization scheme is simple, relatively time-efficient, and requires no energy input and no specialized equipment.

FIG. 1.1B is a representative image of some of the large $MAPbBr_3$ single-crystals we routinely obtained. The overall square shape of the as-grown large single-crystals is in excellent agreement with the room-temperature cubic crystal system of $MAPbBr_3$ perovskite as was confirmed decades ago. The excellent state of the as-grown $MAPbBr_3$ single-crystals, facilitated the collection of high quality single-crystal X-ray diffraction (XRD) data, acquired using a Cu—K$\alpha_I$ excitation (E=8047.8 eV), and the accurate refinement (R=0.0349) of the crystal structure (FIG. 1.1C). The phase purity of the as-grown $MAPbBr_3$ crystals was further confirmed from the powder XRD spectra acquired from material ground from a large batch of single-crystals (~50 pieces of crystals ranging from hundreds of micrometers to several millimeters). The experimental powder XRD is in perfect agreement with the calculated XRD pattern of the cubic $MAPbBr_3$ crystal phase as shown in FIG. 1.1D, confirming 100% phase purity of the as-grown crystals. A slight peak splitting was noticed in the experimental XRD spectrum (see inserted zoom-in view of the (300) diffraction mode in FIG. 1.1D). This is caused by incomplete removal of the closely-lying Cu K$\alpha_{II}$ radiation (E=8027.8 eV). Any remnant discrepancies in the relative peak intensities between the experimental and calculated powder XRD profiles stem from the specific surface orientation of the as-measured powders when exposed to the X-ray beam.

After ascertaining the quality and phase of the as-grown $MAPbBr_3$ single-crystals we proceeded to investigate their optical and charge transport properties. FIGS. 1.2A-B display a typical normalized absorption and PL spectra of a single-crystal in its mother liquor (FIG. 1.2Aa) and a crystalline thin film prepared by a solution-processed two-step deposition approach (FIG. 1.26).[4] A $MAPbBr_3$ single-crystal, stocked in its mother liquor, displays astonishing transparency in spite of its millimeter-scale thickness (inset images in FIG. 1.2A), which is thousands of times thicker than crystalline $MAPbX_3$ thin films (200~400 nm) normally used for high efficiency planar heterojunction PSCs. The high transparency of the crystal enabled us to record its UV-Vis absorption spectrum in transmission mode, while the colorless mother liquor did not absorb in the wavelength region defined in FIGS. 1.2A-B, and thus was used as a reference for the absorption measurements. Storing the single-crystals in the mother liquor also protects the surface from reconstructions caused by prolonged dewetting or exposure to air. The surface structural reconstruction upon dewetting results in the crystal wafers losing their optical sheen, as well as discrepancies in measured transport properties between surface-dominated techniques, such as Hall Effect, and bulk-dominated methods, such as time of flight measurements (vide infra).

The absorption of the $MAPbBr_3$ single-crystals exhibits an onset around 575 nm (FIG. 1.2A)—a red-shift of ~25 nm compared to that of crystalline thin films (FIG. 1.2B) that were produced in this work and reported in the literature.[27, 28] The single-crystal's steep absorption band edge—resembling a step-function above the band gap—is indicative of a clear band structure with low density of in-gap defect and trap states. The rather flat absorption band in the visible region that is energetically above the bandgap for the single-crystal is also a consequence of the clear band structure and the high symmetry of the room-temperature cubic crystal phase. In contrast, the absorption of the nanocrystalline thin films (FIG. 1.2B) presented a differing trend: a noticeably decreasing absorption to lower energy, reaching a valley at 500 nm followed by a strong absorption peak right before the band gap edge. The edge being less steep than its counterpart in the single-crystal spectra (inset in FIG. 1.2B), as well as the strong peak close to the edge are indicative of the high defect and trap states densities in the thin films as a result of decreased crystallinity. These observations are consistent with a recent study which revealed that close to 70% of the solution-processed $MAPbX_3$ perovskite thin film material is comprised of a short-range-ordered structural bonding motif rather than a well-ordered crystal state. The diminished crystallinity may also contribute to a decreased dimensionality of the perovskite structure, which can cause a widening of the bandgap and a consequent blue-shift to the absorption edge. As $MAPbX_3$ is a direct bandgap material, the bandgap may be calculated from the absorption spectra by extrapolating the linear region of the absorption edge to the wavelength-axis intercept, as is diagrammatically shown in the insets of FIG. 1.2A and 1.2B. A band gap of 2.3 eV was determined for the crystalline thin films—in agreement with previous reports,[27, 29] while 2.2 eV was found for the single-crystals. The observation of a narrower band gap in single-crystals provides more incentive for seeking additional improvements in the crystallinity of the perovskite layer in PSCs, as it further sensitizes the absorption spectrum of the cells to harvest a broader range of photons and hence enhance photocurrent generation.

The bandgap of the as-grown MAPbBr$_3$ single-crystals was also studied by photoelectron spectroscopy (PES) and inverse photoelectron spectroscopy (IPES) methods. The complete electronic structures of MAPbBr$_3$ single-crystals obtained by a combination of PES and IPES are shown in FIG. 1.7. The electronic structure is comprised of four spectral features located at −2.3, −2.8, −3.9, and −5.7 eV with the valence band maximum at −3.93 eV. The valence band edge appears significantly sharper than that of the respective thin films,[29] whereas the conduction band consists of three spectral features observed at 2.6, 4, and 5.1 eV, and is somewhat look similar to that of the thin films. The electronic bandgap of the crystal is estimated to be 2.37 eV, with the valence band maximum (VBM) positioned at −1.82 eV and conduction band minimum (CBM) at 0.55 eV above the Fermi level, and in a good agreement with the optically estimated bandgap (FIG. 1.2A-B). A slightly larger bandgap value via photoemission spectroscopies is to be expected. Optical absorption measurements may result in a slightly underestimate of the actual ground state bandgap because optical excitations leave a hole in the valence band, which through Coulombic interaction, may decrease the observed gap.

In addition to absorption, the emission behavior of MAPbBr$_3$ single-crystals is also markedly different than thin films (FIG. 1.2A-B). The crystal's PL spectrum shows a single narrow peak at 570 nm with a stokes-shift of only 20 nm from the first absorption peak. The relatively small shift is likely a consequence of the highly restricted vibrational relaxation within the [PbBr$_6$]$^{4-}$ octahedra which are connected via a corner-sharing network in the three-dimensional cubic lattice.[14] In contrast, the PL of the MAPbBr$_3$ thin films reveals multiple features that have qualitatively different origins than the ones observed in the emission spectra of single-crystals. The main peak occurring at 540 nm in thin films, with an apparently narrow stokes-shift of 18 nm, likely originates from the low-dimensional structurally coherent units within the MAPbBr$_3$ film, whereas the noticeable peak at longer wavelength around 580 nm is probably resultant from the intrinsic photoluminescence of the three-dimensional crystalline component of the MAPbBr$_3$ lattice. The increased defect and trap state densities in the nanocrystalline thin films, relative to single-crystals, provide more degrees of freedom for vibronic relaxation resulting in a larger stokes shift of 58 nm (FIG. 1.2B). The weak PL signals below the bandgap, appearing around 620 nm 645 nm, are probably originating from transitions directly involving defect trap-states within the thin films.

Spurred by the steady-state optical characteristics of the MAPbBr$_3$ single-crystals, we investigated various key quantities that are considered indicative of the material's potential for PSCs: (i) the carrier lifetime τ; (ii) the carrier mobility μ; and (iii) the in-gap trap density $n_{trap}$. Most importantly, from (i) and (ii) we can derive the carrier diffusion length $L_D$ using the relation $L_D=\sqrt{k_B T \cdot \mu \cdot \tau}$ (where $k_B$ is Boltzmann's constant and T is the sample temperature).

The mobility of carriers throughout the bulk of the crystalline samples has been measured using a time-of-flight (TOF) technique.[30] The TOF probing scheme hinges on a few requirements: (i) a pulsed light excitation with energy larger than the material's bandgap: $\hbar\omega > E_g$; (ii) an absorption depth ($\alpha^{-1}$) much smaller than the sample thickness d (ad≫1); (iii) the need for a transparent electrode allowing light illumination on one side; (iv) the RC time constant of the detection circuitry being much smaller than the transit time τ. In our experimental setup, carriers are photogenerated at one side of the crystal using a pulsed laser (λ=355 nm), while the associated current transient is recorded by measuring the voltage drop as a function of time across a resistor connected in series to the crystal. A top (transparent In-doped SnO$_2$) and bottom (a MoO$_3$/Au/Ag stack) electrodes are utilized in order to apply the driving voltage which is used to accelerate the charges across the crystal.

When the tail of the current pulse associated with the carrier wave packet reaches the bottom electrode, a drop in the measured current (I) vs. time (t) is observed in the form of a kink: the position of the kink defines the transit time $\tau_t$. The corresponding experimental traces I(t), for various driving voltages (V), are shown in FIG. 1.3A, on a bi-logarithmic scale; the transit time is marked by the blue squares and the corresponding values are plotted in the inset as a function of $V^{-1}$, and in FIG. 1.3B as a function of V. The mobility μ can be directly estimated from its definition v=μE, where v is the carrier velocity, obtained from the ratio between the sample thickness and transit time (v=d/τ), while the electric field is simply given by E=V/d. Altogether this leads to the formula μ=d$^2$/Vτ, which is used to extract the mobility values in FIG. 1.3B (red markers). The highest mobility (at 140 V) is found to be around 150 cm$^2$/Vs, while the average of all data points returns a value of 115 cm$^2$/Vs (red dashed line). Lastly, we can also estimate the mobility by a linear fit of μ vs. $V^{-1}$, in which case we obtain 105 cm$^2$/Vs (dark red dashed line). Complementary Hall effect measurements at room temperature returned a positive Hall coefficient $R_H$~1-1.9×10$^5$ m$^2$/C, revealing that holes are the majority carriers, with a concentration around $n_c$~2-5×10$^{10}$ cm$^{-3}$; from the same experiments, the mobility was found to range between 30-70 cm$^2$/Vs. The discrepancy with the TOF results is readily explained by the different experimental geometry: while in a TOF measurement the photogenerated carriers have to migrate across the entire bulk of the crystal, the Hall effect is more surface-sensitive, since the 4-point electrodes are deposited on the same crystal face. As a consequence, the measured mobility can be lower than using bulk methods, due to, e.g. a higher defect or trap concentration near the surface. Ultimately, these values for the bulk mobility of hole carriers in MAPbBr$_3$ place this compound alongside lower-band-gap semiconducting materials such as, e.g., Si or GaAs[31]—highlighting the great potential of crystalline organometallic halides for an even greater photovoltaic performance than thin-film-based photovoltaic devices.

Next we turn our attention to the carrier lifetime τ; the latter is estimated from time-resolved photoluminescence (PL) spectra. The time (t) and wavelength (λ) resolved PL map $I_{PL}(t, \lambda)$ (see FIG. 1.3C) has been acquired over a time window of 1 μs and in the wavelength region around the main band-to-band recombination PL peak at 580 nm (λ: 500-680 nm). The time-dependent PL signal is representative of the transient evolution of the electron-hole population following the impulsive (Δt~0.7 ns) photoexcitation using a 355 nm LED source. The PL decay trace at λ=580 nm (blue circles) is superimposed onto the color map together with the background signal which is very short-lived (see shaded grey area at short times). The wavelength-dependent PL can be evaluated within different time windows (t: 0-20, 20-200, 200-1000 ns) and are compared to the time-integrated PL profile (green area) in FIG. 1.3D. All curves show a peak at 580 nm, consistently with the PL measured using continuous light excitation (see FIG. 1.2A); at short times (t: 0-20 ns) a shoulder can be seen on the low-wavelength side, which is associated to the impulsive background which indeed disappears for longer time scales. After subtraction of the impulsive background we obtain a PL temporal profile which is uniquely representative of the internal carrier dynamics in the sample, and is shown FIG. 1.3E on a logarithmic plot. The corresponding data points are fitted with a bi-exponential decay (black and gray lines) comprised of a fast and a slow dynamics (τ~152 ns and 726 ns, respectively). Ultimately, by combining the long (short) carrier lifetime component with the highest (lowest) measured bulk mobility we obtain a maximum carrier lifetime of $L_D$~16.8 μm (6.3 μm). Therefore, crystalline $MAPbBr_3$ is characterized by a charge transport efficiency which outperforms thin-film-based materials in all three key figures of merit, i.e. mobility, lifetime, and diffusion length. For comparison, we also investigated the PL decay of the as-prepared crystalline thin films of $MAPbBr_3$ as shown in FIG. 1.8. There dynamics were observed with two very fast ones (~1 and ~17 nm) and a slower one (~20 ns). Convincingly in all cases, the PL decays faster than the single crystals. This suggest large trap-induced recombination rate in the crystalline thin films which are expected to consist of much higher trap state density than the single crystals.

We also investigate the picosecond dynamics upon photo-excitation of the single-crystal and crystalline thin films using broadband femtosecond (120 fs temporal resolution) transient absorption (TA) spectroscopy—, which provides direct information regarding carrier dynamics and excited state deactivation pathways including electron trapping.

As can be clearly seen in FIG. 1.4, under the same experimental conditions, the decay of the excited state due to the electron hole recombination of single-crystals is much longer than the thin film (lower panel of FIG. 1.4). The observed decay can be attributed to trap-assisted recombination of charge carriers, indicating that substantially fewer defect trap-states are present in the single-crystal relative to the thin film. This finding is consistent with the long carrier lifetimes extracted from photoluminescence experiments on single-crystals.

In order to unveil the physical reasons underlying the superior carrier transport and long lifetimes in single-crystals, we investigated the presence and concentration of in-gap trap states by measuring the current-voltage (I-V) response of the crystals. The experimental scheme uses a rather simple geometry with two electrodes on opposite sides of the sample, which is kept under vacuum (p~$10^{-4}$ mbar) and in the dark. The I-V points have been acquired using a sub-pA Keithley electrometer in the range 0-15 V, and are presented in FIG. 1.5 (purple markers). Three regimes can be clearly discerned in the experimental data: at low voltages, the I-V response is Ohmic, i.e. linear, as confirmed by the fit to a I~V functional dependence (blue line). At intermediate voltages, the intensity has a rapid rise that sets in at $V_{TFL}$=4.27 V and signals the transition onto the trap-filled limit (TFL)—a regime where the injected carriers are able to fill all the available trap states.[32] The onset voltage $V_{TFL}$ bears a direct connection to the density of trap states $n_t$, through the formula [3]: $V_{TFL}=en_td^2/2\in\in_0$, where $\in_0$ is the vacuum permittivity, while $\in$ represents the material's dielectric constant—here we use $\in$=25.5.[33] Correspondingly, we find a rather low trap density, $n_t$=1.4×$10^{10}$ $cm^{-3}$, which, together with the extremely clean absorption and PL profiles (see again FIG. 1.2A), points to a nearly defect-free electronic structure. The defect-density measured for the room-temperature grown $MAPbBr_3$ crystals outshines a wide array of established and emerging optoelectronic semiconductors including: GaAs and related compounds ($n_t$~$10^{16}$ $cm^{-3}$); polycrystalline Si ($n_t$~$10^{13}$-$10^{14}$ $cm^{-3}$)[41]; CdTe/CdS ($n_t$~$10^{11}$-$10^{13}$ $cm^{-3}$) and CIGS ($n_t$~$10^{13}$ $cm^{-3}$) thin films[42]; and single-crystal rubrine ($n_t$~$10^{16}$ $cm^{-3}$) and pentacine ($n_t$~$10^{14}$-$10^{15}$ $cm^{-3}$);[34, 35] as well as polymers ($n_t$~$10^{10}$ $cm^{-3}$). Only ultra-high-quality c-Si, grown at high temperatures offers comparable, and in special cases, better densities ($10^8$<$n_t$<$10^{15}$ $cm^{-3}$).[36, 37, 38]

For V>$V_{TFL}$ the current response is strongly non-linear, with a power-law behavior I~$V^n$ whose exponent n (here we find n~8.9) is typically related to the energetic distribution of trap states[39] and therefore material-dependent. Lastly, for larger voltages, the I-V response approaches a space-charge-limited-current (SCLC) behavior, which occurs when the rate of carrier injection exceeds the maximum current that the sample can intrinsically sustain. This regime is also non-linear and follows Child's law, which asserts that the current shall be quadratic in the voltage, I~$V^2$ (gold line).

Finally, we note that the crystal growth methodologies described in this work are promising not only for $MAPbBr_3$ crystals, but also $MAPbX_3$ perovksites in general. Though the optimization is preliminary we have managed through the selective choice of miscible solvent and anti-solvent, to grow single-crystals of $MAPbCl_3$ and the much sought after $MAPbI_3$ (~2 mm×2 mm×1 mm square) (FIG. 1.9). Further optimization of the crystallization conditions towards large and high quality $MAPbI_3$ single-crystals is ongoing in our lab.

Conclusions:

In summary, we demonstrated a simple yet efficient method to grow high-quality $MAPbBr_3$ single-crystal wafers at room temperature. This method is also applicable for growing other $MAPbX_3$ single-crystal wafers through selective choice of solvents and control crystallization conditions. The as-grown single-crystals display remarkably superior properties over state-of-the-art solution-processed crystalline thin films, and comparable to the best optoelectronic grade semiconductor: extremely low defect and trap state densities, outstanding charge-carrier mobility, long-lived photogenerated carrier lifetimes, and extremely long carrier diffusion lengths. The simple fabrication process and outstanding materials properties showcased in this study pave the way for a further evolution in PSCs, to adopt single-crystals or highly crystalline perovskites in the device architecture, and provide an incentive for researchers to consider these impressive solution grown semiconductors for broader optoelectronic device applications.

Methods:

The methylammonium bromide (MABr) precursor was synthesized through the reaction of hydrobromide acid (HBr) with methylamine followed by recrystallization from ethanol. An equimolar amount of HBr acid (48% in water) was added dropwise into the methylamine (40% in methanol) at 0° C. under stirring. Then the mixture was stirred for 2 h at 0° C. Removal of the solvent was followed by recrystallization from ethanol to yield a snow-white MABr powders. The crystalline $MAPbBr_3$ thin films deposited on glass substrate were prepared through two-step solution processed procedures.[4] A thin layer of $PbBr_2$ was initially coated onto the glass substrate by spin coating a solution of $PbBr_2$ in DMF (200 mg/mL). The spin-coated $PbBr_2$ thin film was then annealed at 100° C. for 30 min. Subsequently, the as-annealed white $PbBr_2$ thin film was immersed into MABr solution in anhydrous isopropanol (10 mg/mL) for 15 min at room temperature, which yielded a yellow thin film. Finally the as-obtained yellow thin film was gently rinsed with isopropanol and annealed at 80° C. for 1 h. The IPES spectra were obtained by using incident electrons with varying kinetic energy while detecting the emitted photons at a fixed energy (9.7 eV) using a Geiger-Müller detector. The inverse photoemission spectroscopy resolution was limited by an instrumental linewidth of approximately 400 meV. For XPS experiments we used PHI Versa Probe II instrument equipped with monochromatic Al K(alpha) source. Instrument base pressure was ca. $8 \times 10^{-10}$ Torr. The X-ray power of 65 W at 15 kV was used for all experiments with 260 micron beam size at the X-ray incidence and take off angles of 45°. The instrument work function was calibrated to give a binding energy (BE) of 84.0 eV for Au $4f_{7/2}$ line for metallic gold and the spectrometer dispersion was adjusted to give a BE's of 284.8 eV for the C 1s line of adventitious (aliphatic) carbon. The PHI double charge compensation system was used on all samples. The electron charge neutralizer settings were adjusted for each sample to give a BE of 284.8 eV for the C 1s line. The ultimate Versa Probe II instrumental resolution was determined to be 0.35 eV using the Fermi edge of the valence band for metallic silver. The resolution with charge compensation system was <0.68 eV FWHM on PET. All the spectra were collected at room temperature. All XPS spectra were recorded using PHI software SmartSoft-XPS v2.0 and processed using PHI MultiPack v9.0 and/or CasaXPS v.2.3.14. The experimental setup for TA measurements is detailed elsewhere.[40] Briefly, it employed a white-light-continuum probe pulse generated in a 2-mm-thick sapphire plate in an Ultrafast System LLC spectrometer using a few µJ pulse energy of the fundamental output of a Ti:Sapphire fs regenerative amplifier operating at 800 nm with 35 fs pulses and a repetition rate of 1 kHz. The pump pulses at 440 nm were created from femtosecond pulses generated in an optical parametric amplifier (Spectra-Physics). The pump and probe beams were focused on the sample solution, and the transmitted probe light from the samples was collected and focused on the broadband UV-visible detector to record the time-resolved transient absorption spectra.

References for Example 1

1. Kojima A, Teshima K, Shirai Y, Miyasaka T. Organometal Halide Perovskites as Visible-Light Sensitizers for Photovoltaic Cells. *J Am Chem Soc* 2009, 131(17): 6050-6051.
2. Kim H-S, Lee C-R, Im J-H, Lee K-B, Moehl T, Marchioro A, et al. Lead Iodide Perovskite Sensitized All-Solid-State Submicron Thin Film Mesoscopic Solar Cell with Efficiency Exceeding 9%. *Sci Rep* 2012, 2.
3. Lee M M, Teuscher J, Miyasaka T, Murakami T N, Snaith H J. Efficient Hybrid Solar Cells Based on Meso-Superstructured Organometal Halide Perovskites. *Science* 2012, 338(6107): 643-647.
4. Burschka J, Pellet N, Moon S-J, Humphry-Baker R, Gao P, Nazeeruddin M K, et al. Sequential deposition as a route to high-performance perovskite-sensitized solar cells. *Nature* 2013, 499(7458): 316-319.
5. Liu M, Johnston M B, Snaith H J. Efficient planar heterojunction perovskite solar cells by vapour deposition. *Nature* 2013, 501(7467): 395-398.
6. Wang J T-W, Ball J M, Barea E M, Abate A, Alexander-Webber J A, Huang J, et al. Low-Temperature Processed Electron Collection Layers of Graphene/TiO2 Nanocomposites in Thin Film Perovskite Solar Cells. *Nano Lett* 2013, 14(2): 724-730.
7. Liu D, Kelly T L. Perovskite solar cells with a planar heterojunction structure prepared using room-temperature solution processing techniques. *Nat Photon* 2014, 8(2): 133-138.
8. Wojciechowski K, Saliba M, Leijtens T, Abate A, Snaith H J. Sub-150 [degree] C. processed meso-superstructured perovskite solar cells with enhanced efficiency. *Energy Environ Sci* 2014, 7(3): 1142-1147.
9. Jeon N J, Noh J H, Kim Y C, Yang W S, Ryu S, Seok S I. Solvent engineering for high-performance inorganic-organic hybrid perovskite solar cells. *Nat Mater* 2014.
10. Green M A, Ho-Baillie A, Snaith H J. The emergence of perovskite solar cells. *Nat Photon* 2014, 8(7): 506-514.
11. Snaith H J. Perovskites: The Emergence of a New Era for Low-Cost, High-Efficiency Solar Cells. *J Phys Chem Lett* 2013, 4(21): 3623-3630.
12. Park N-G. Organometal Perovskite Light Absorbers Toward a 20% Efficiency Low-Cost Solid-State Mesoscopic Solar Cell. *J Phys Chem Lett* 2013, 4(15): 2423-2429.
13. Mohammad K N, Gao P, Gratzel M. Organohalide Lead Perovskites for Photovoltaic Applications. *Energy Environ Sci* 2014.
14. Mitzi D B. Synthesis, Structure, and Properties of Organic-Inorganic Perovskites and Related Materials. *Progress in Inorganic Chemistry*, vol. 48. John Wiley & Sons, Inc., 1999, pp 1-121.
15. Stranks S D, Eperon G E, Grancini G, Menelaou C, Alcocer M J P, Leijtens T, et al. Electron-Hole Diffusion Lengths Exceeding 1 Micrometer in an Organometal Trihalide Perovskite Absorber. *Science* 2013, 342(6156): 341-344.
16. Xing G, Mathews N, Sun S, Lim S, Lam Y M, Gratzel M, et al. Long-range balanced electron- and hole-transport lengths in organic-inorganic CH3NH3PbI3. *Science* 2013, 342(6156): 344-347.
17. Wehrenfennig C, Eperon G E, Johnston M B, Snaith H J, Herz L M. High charge carrier mobilities and lifetimes in organolead trihalide perovskites. *Adv Mater* 2014, 26(10): 1584-1589.
18. Wehrenfennig C, Liu M, Snaith H J, Johnston M B, Herz L M. Charge-carrier dynamics in vapour-deposited films of the organolead halide perovskite CH3NH3PbI3-xClx. *Energy Environ Sci* 2014, 7(7): 2269-2275.
19. Chung I, Lee B, He J, Chang R P H, Kanatzidis M G. All-solid-state dye-sensitized solar cells with high efficiency. *Nature* 2012, 485(7399): 486-489.
20. Etgar L, Gao P, Xue Z, Peng Q, Chandiran A K, Liu B, et al. Mesoscopic CH3NH3PbI3/TiO2 Heterojunction Solar Cells. *J Am Chem Soc* 2012, 134(42): 17396-17399.
21. Chen Q, Zhou H, Hong Z, Luo S, Duan H-S, Wang H-H, et al. Planar Heterojunction Perovskite Solar Cells via Vapor-Assisted Solution Process. *J Am Chem Soc* 2013, 136(2): 622-625.
22. Liang P-W, Liao C-Y, Chueh C-C, Zuo F, Williams S T, Xin X-K, et al. Additive Enhanced Crystallization of Solution-Processed Perovskite for Highly Efficient Planar-Heterojunction Solar Cells. *Adv Mater* 2014, 26(22): 3748-3754.
23. Eperon G E, Burlakov V M, Docampo P, Goriely A, Snaith H J. Morphological Control for High Performance, Solution-Processed Planar Heterojunction Perovskite Solar Cells. *Adv Funct Mater* 2014, 24(1): 151-157.
24. Cohen B-E, Gamliel S, Etgar L. Parameters influencing the deposition of methylammonium lead halide iodide in hole conductor free perovskite-based solar cells. *APL Materials* 2014, 2(8): -.

25. Choi J J, Yang X, Norman Z M, Billinge S J L, Owen J S. Structure of Methylammonium Lead Iodide Within Mesoporous Titanium Dioxide: Active Material in High-Performance Perovskite Solar Cells. *Nano Lett* 2013, 14(1): 127-133.
26. Benvenuti M, Mangani S. Crystallization of soluble proteins in vapor diffusion for x-ray crystallography. *Nat Protocols* 2007, 2(7): 1633-1651.
27. Edri E, Kirmayer S, Cahen D, Hodes G. High Open-Circuit Voltage Solar Cells Based on Organic-Inorganic Lead Bromide Perovskite. *J Phys Chem Lett* 2013, 4(6): 897-902.
28. Edri E, Kirmayer S, Kulbak M, Hodes G, Cahen D. Chloride Inclusion and Hole Transport Material Doping to Improve Methyl Ammonium Lead Bromide Perovskite-Based High Open-Circuit Voltage Solar Cells. *J Phys Chem Lett* 2014: 429-433.
29. Schulz P, Edri E, Kirmayer S, Hodes G, Cahen D, Kahn A. Interface energetics in organo-metal halide perovskite-based photovoltaic cells. *Energy Environ Sci* 2014, 7(4): 1377-1381.
30. Haynes J R, Shockley W. The Mobility and Life of Injected Holes and Electrons in Germanium. *Physical Review* 1951, 81(5): 835-843.
31. del Alamo J A. Nanometre-scale electronics with III-V compound semiconductors. *Nature* 2011, 479(7373): 317-323.
32. Lampert M A, Mark P. *Current injection in solids*. Academic Press, 1970.
33. Poglitsch A, Weber D. Dynamic disorder in methylammoniumtrihalogenoplumbates (II) observed by millimeter-wave spectroscopy. *The Journal of Chemical Physics* 1987, 87(11): 6373-6378.
34. Yang Y S, Kim S H, Lee J-I, Chu H Y, Do L-M, Lee H, et al. Deep-level defect characteristics in pentacene organic thin films. *Applied physics letters* 2002, 80(9): 1595-1597.
35. Goldmann C, Krellner C, Pernstich K, Haas S, Gundlach D, Batlogg B. Determination of the interface trap density of rubrene single-crystal field-effect transistors and comparison to the bulk trap density. *Journal of applied physics* 2006, 99(3): 034507.
36. Haynes J, Hornbeck J. Trapping of minority carriers in silicon. II. n-type silicon. *Physical Review* 1955, 100(2): 606.
37. Hornbeck J, Haynes J. Trapping of minority carriers in silicon. I. p-type silicon. *Physical Review* 1955, 97(2): 311.
38. Hu Y, Schøn H, Nielsen Ø, Øvrelid E J, Arnberg L. Investigating minority carrier trapping in n-type Cz silicon by transient photoconductance measurements. *Journal of Applied Physics* 2012, 111(5): 053101.
39. Mark P, Helfrich W. Space-Charge-Limited Currents in Organic Crystals. *J Appl Phys* 1962, 33(1): 205-215.
40. El-Ballouli AaO, Alarousu E, Bernardi M, Aly S M, Lagrow A P, Bakr O M, et al. Quantum Confinement-Tunable Ultrafast Charge Transfer at the PbS Quantum Dot and Phenyl-C61-butyric Acid Methyl Ester Interface. *J Am Chem Soc* 2014, 136(19): 6952-6959.
41. Ayres, J. R. Characterization of trapping states in polycrystalline-silicon thin film transistors by deep level transient spectroscopy. *J. Appl. Phys.* 74, 1787-1792 (1993); and Capan, I., Borjanović, V., Pivac, B. Dislocation-related deep levels in carbon rich p-type polycrystalline silicon. *Sol Energy Mater Sol Cells* 91, 931-937 (2007).
42. Balcioglu, A., Ahrenkiel, R. K., Hasoon, F. Deep-level impurities in CdTe/CdS thin-film solar cells. *J. Appl. Phys.* 88, 7175-7178 (2000); Versluys, J., Clauws, P., Nollet, P., Degrave, S., Burgelman, M. DLTS and admittance measurements on CdS/CdTe solar cells. *Thin Solid Films* 431-432, 148-152 (2003).

Example 2

The fundamental properties, and ultimate performance limits, of organolead trihalide MAPbX$_3$ (MA=CH$_3$NH$_3^+$; X=Br$^-$, or I$^-$) perovskites remain obscured by extensive disorder in polycrystalline MAPbX$_3$ films. We report an antisolvent vapor-assisted crystallization (AVC) approach that enables us to create sizable crack-free MAPbX$_3$ single crystals with volumes exceeding 100 cubic millimeters. These large single crystals enabled a detailed characterization of their optical and charge transport characteristics. We observed exceptionally low trap-state densities of order 10$^9$ to 10$^{10}$ per cubic centimeter MAPbX$_3$ single crystals (comparable to the best photovoltaic-quality silicon) and charge-carrier diffusion lengths exceeding 10 µm. These results were validated with density functional theory calculations.
Introduction:

Solution-processed hybrid organolead trihalide (MAPbX$_3$) perovskite solar cells (PSCs) have now achieved 20.1% certified power conversion efficiencies (PCE) (1), following a rapid surge of development since perovskite-based devices were reported in 2009 (2). A key to the success of PSCs is the long diffusion length of charge carriers in the absorber perovskite layer (3). This parameter is expected to depend strongly on film crystallinity and morphology. Thermally-evaporated MAPbI$_3$ films fabricated using a Cl$^-$-based metal salt precursor was reported to exhibit three times longer carrier diffusion length than the best solution-processed materials, yet no measurable Cl$^-$ was incorporated in the final films, hinting at a major but unclear mechanism in the control of crystallinity and morphology (4, 5). These observations suggest that there may be room to improve upon already remarkable PSC efficiencies via the optimization of three key parameters: charge carrier lifetime, mobility, and diffusion length.

The quest for further improvements in these three figures of merit motivated our exploration of new experimental strategies for the synthesis of large single crystal MAPbX$_3$ perovskites that would exhibit phase purity and macroscopic (millimeter) dimensions. Unfortunately, previously published methods failed to produce single crystals with macroscopic dimensions large enough to enable electrode deposition and practical characterization of electrical properties (6). Past efforts based on cooling-induced crystallization were hindered by the limited extent to which solubility could be influenced by controlling temperature; the complications arising from temperature-dependent phase transitions in MAPbX$_3$; and the impact of convective currents (arising from thermal gradients in the growth solution) that disturb the ordered growth of the crystals. We hypothesized that a strategy using antisolvent vapor-assisted crystallization (AVC), in which an appropriate antisolvent is slowly diffused into a solution containing the crystal precursors, could lead to the growth of sizable high-quality (crack-free, smooth surfaces, well-shaped borders, and clear bulk transparency) MAPbX$_3$ crystals. Prior attempts to grow hybrid perovskite crystals with AVC have fallen short of these qualities, a fact we tentatively attributed to the use of alcohols as antisolvents (7). Alcohols act as good solvents for the organic salt MAX (8) in light of solvent-solute hydrogen bond interactions; as a result, they can solvate MA+ during the ionic assembly of the crystal, potentially disrupting long-range lattice order.

We instead implemented AVC (FIG. 2.1A) using a solvent with high solubility and moderate coordination for MAX and PbX$_2$ [N,N-dimethylformamide (DMF) and γ-butyro-lactone (GBA)] and an antisolvent in which both perovskite precursors are completely insoluble (dichloromethane, DCM). We reasoned that DCM, unlike alcohols, is an extremely poor solvent for both MAX and PbX$_2$ and lacks the ability to form hydrogen bonds, thus minimizing asymmetric interactions with the ions during their assembly into crystal form. When combined with a slow and controlled diffusion rate into DMF, our approach established the conditions for all the ionic building blocks of the perovskite to be co-precipitated from solution stoichiometrically.

Using this method, we grew high-quality, millimeter-sized MAPbBr$_3$ and MAPbI$_3$ single crystals [FIGS. 2.5A-B (9)] whose shape conformed to the underlying symmetry of the crystal lattice. The phase purity of the as-grown crystals was confirmed by x-ray diffraction (XRD) performed on powder ground from a large batch of crystals (FIG. 2.1B).

The synthesized crystals were of sufficient quality and macroscopic dimensions to enable a detailed investigation of the optical and charge transport properties. The absorbance of MAPbX$_3$ (X=Br$^-$, or I$^-$) (FIG. 2.2) shows a clear band edge cut-off with no excitonic signature, which suggests a minimal number of in-gap defect states. For comparison, the absorption spectrum from the polycrystalline MAPbBr$_3$ [FIG. 2.6 (9)] and MAPbI$_3$ (5) thin films shows a peak near the band gap, which is often attributed to an excitonic transition. This observation is consistent with a substantial amount of disorder and lack of long-range structural coherence in nanostructured thin films (10). By extrapolating the linear region of the absorption edge to the energy-axis intercept [FIG. 2.2 and FIG. 2.7 (9)], we determined the optical band gaps of MAPbBr$_3$ and MAPbI$_3$ single crystals of 2.21 and 1.51 eV, respectively. Both materials in their single crystalline form exhibit a substantially narrower band gap than the corresponding films that could enhance photon harvesting and hence improve photocurrent generation.

As also shown in FIG. 2.2, both MAPbBr$_3$ and MAPbI$_3$ exhibit a narrow photoluminescence (PL) that peaks near the band edge. A noticeable shoulder at ~790 nm on the PL of MAPbI$_3$ single crystals is in agreement with the PL from thin films (5), with the main PL peaking at 820 nm attributed to the intrinsic PL from MAPbI$_3$ crystal lattice. A more structured PL spectrum was observed for polycrystalline MAPbBr$_3$ thin films [FIG. 2.6 (9)].

We investigated the key quantities that directly impact a material's potential for application in PSC: carrier lifetime τ, carrier mobility μ, and carrier diffusion length LD. In addition, we estimated the in-gap trap density $n_{trap}$ in order to correlate such quantity to the observed diffusion length. For MAPbBr$_3$ single crystal, we first measured carrier mobility using the time-of-flight (TOF) technique (11). The transient current (t) was measured for various driving voltages (V), and the corresponding traces are shown in FIG. 2.3A, on a bilogarithmic scale. The transit time τt, defined as the position of the kink in the time traces, is marked by the blue squares and the corresponding values are plotted in the inset as a function of V$^{-1}$, and in FIG. 2.3B as a function of V. The mobility μ[μ=μp≅μn (12, 13)] can be directly estimated from the transit time τt, sample thickness d, and applied voltage V as μ=d$^2$/Vτ$_t$ (FIG. 2.3B) (9). Estimating mobility via a linear fit of τ vs. V$^{-1}$ led to an estimate of 115 cm$^2$/Vs. Complementary Hall effect measurements at room temperature confirmed a carrier concentration of between 2×10$^{10}$ and 5×10$^{10}$ cm$^{-3}$, and provided a mobility estimate in the range from 20 to 60 cm$^2$/Vs. Slightly lower mobilities obtained via Hall Effect may be ascribed to surface effects that are negligible for TOF, a bulk probe.

For MAPbI$_3$ single crystal, we estimated the carrier mobility using the space-charge-limited current (SCLC) technique. We measured the I-V trace for the crystals and observed a region showing a clear quadratic dependency of the current on the applied voltage at 300 K (FIG. 2.12 in SI for details). From this region, we could conservatively estimate the carrier mobility obtaining the value μ=2.5 cm$^2$/Vs. From the linear ohmic region, we also identified the conductivity of the crystal to be σ=1×10$^{-8}$ (ohm cm)$^{-1}$. Combining the information on mobility and conductivity, we estimated a carrier concentration of $n_c$=σ/qμ≈2×10$^{10}$ cm$^{-3}$.

We estimated the carrier lifetime from transient absorption (TA) and PL spectra. Nanosecond pump-probe TA spectroscopy was carried out over a window covering the nanosecond to microsecond timescales in order to evaluate the fast (τ~74 ns) as well the slow (τ~978 ns) carrier dynamics, as determined from biexponential fits. Time (t)— and wavelength (λ)-resolved PL maps IPP(t, λ) (see FIG. 2.3D) of single crystalline MAPbBr$_3$ were acquired in the wavelength region around the main band-to-band recombination peak at 580 nm (λ500 to 680 nm). The time-dependent PL signals in single crystalline samples of MAPbBr$_3$ and MAPbI$_3$ are shown in FIG. 2.3E and 2.3F, respectively; the data were measured at the wavelength of the main PL peak, i.e. λ=580 nm and λ=820 nm for MAPbBr$_3$ and MAPbI$_3$, respectively (see inset).

The time-resolved traces are representative of the transient evolution of the electron-hole population following impulsive (Δt~0.7 ns) photoexcitation. Biexponential fits (blue traces) were performed to quantify the carrier dynamics [FIG. 2.8 (9)]. Both the bromide- and iodide-based perovskite crystals exhibit a superposition of fast and a slow dynamics: τ~41 and 357 ns for MAPbBr$_3$, and τ~22 and 1032 ns for MAPbI$_3$. We assign these two very different time scales to the presence of a surface component (fast) together with a bulk component (slow), which reveals the lifetime of carriers propagating deeper in the material. The relative contribution of these two terms to the static PL can be readily evaluated by integrating the respective exponential traces (the integral is equal to the product of the amplitude A times the decay time τ), which shows that the fast (tentatively surface) component amounts to only 3.6% of the total TA signal in MAPbBr$_3$, and to 12% and 7% of the total PL signal in MAPbBr$_3$ and MAPbI$_3$, respectively. Ultimately, by combining the longer (bulk) carrier lifetimes with the higher measured bulk mobility, we obtained a best-case carrier diffusion length LD=(kBT·μ·τ)$^{1/2}$ (where kB is Boltzmann's constant and T is the sample temperature) of ~17 μm in MAPbBr$_3$, while use of the shorter lifetime and lower mobility led to a ~3 μm estimate. The same considerations were applied for the MAPbI$_3$ crystals to obtain a best-case diffusion length of ~8 μm and a worst-case of ~2 μm.

For comparison, we also investigated the PL decay of solution-processed thin films of MAPbBr$_3$ as shown in FIG. 2.9. We find again two dynamics, a fast decay (τ~13 ns) and a longer-lived component (τ~168 ns), in both cases faster than the single crystals. This result suggests a larger trap-induced recombination rate in the thin films, which are expected to possess a much higher trap density than the single crystals. Previous studies on non-Cl-doped MAPbI$_3$ nanostructured thin films also corroborate this trend, revealing a PL lifetime of ~10 ns and a carrier diffusion length of ~100 nm (3, 5).

Crystalline MAPbX$_3$ is characterized by a charge transport efficiency that outperforms thin-film-based materials in mobility, lifetime, and diffusion length. In order to unveil the physical origins of this difference, we investigated the concentration of in-gap deep electronic trap states. We measured the I-V response of the crystals in SCLC regime (FIG. 2.4). Three regions were evident in the experimental data. At low voltages, the I-V response was Ohmic, i.e. linear, as confirmed by the fit to a I~V functional dependence (blue line). At intermediate voltages, the current exhibited a rapid nonlinear rise (set in at VTFL=4.6 V for MAPbBr$_3$ and 24.2 V for MAPbI3) and signaled the transition onto the trap-filled limit (TFL)—a regime in which all the available trap states were filled by the injected carriers (14). The onset voltage VTFL is linearly proportional to the density of trap states n$_t$ (FIG. 2.4A). Correspondingly, we found for MAPbBr$_3$ single crystals a remarkably low trap density n$_t$=5.8×10$^9$ cm$^{-3}$, which, together with the extremely clean absorption and PL profiles (see again FIG. 2.2A), points to a nearly defect-free electronic structure. At high fields, the current showed a quadratic voltage dependence in the Child's regime. In this region, we extracted the value for the trap-free mobility μ. We found μ=38 cm$^2$/Vs (FIG. 2.4A), a value in good agreement with the mobility extracted using ToF and Hall effect (FIGS. 2.11A-B and Section V in SI). We determined a comparable low trap density n$_t$=3.3×10$^{10}$ cm$^{-3}$ for MAPbI3 single crystals using the same method (FIG. 2.4B).

The defect density measured for the room-temperature grown MAPbX$_3$ crystals was superior to a wide array of established and emerging optoelectronic inorganic semiconductors including polycrystalline Si (n$_t$~10$^{13}$ to 10$^{14}$ cm$^{-3}$) (15, 16), CdTe/CdS (n$_t$~10$^{11}$ to 10$^{13}$ cm$^{-3}$) (17), and CIGS (n$_t$~10$^{13}$ cm$^{-3}$) thin films (18), as well as organic materials such as single-crystal rubrene (n$_t$~10$^{16}$ cm$^{-3}$) (19) and pentacene (n$_t$~10$^{14}$ to 10$^{15}$ cm$^{-3}$) (20). Only ultrahigh-quality c-Si, grown at high temperatures, offers comparable or better deep trap densities (10$^8$<n$_t$<10$^{15}$ cm$^{-3}$) (21, 22). The exceptionally low trap density found experimentally can be explained with the aid of density functional theory (DFT) calculations performed on MAPbBr$_3$, which predict a high formation energy for deep trap defects when MAPbBr3 is synthesized under Br-rich conditions, e.g., from PbBr$_2$ and MABr, such as is the case in this study (9).

Materials and Methods

Precursor Synthesis. The methylammonium halide precursors MAX (MA=CH$_3$NH$_3^+$, X=Br$^-$ or I$^-$) were synthesized through the reaction of hydrohalide acid HX (X=Br or I) with methylamine followed by recrystallization from ethanol. An equimolar amount of HX acid solution in water was added dropwise into the methylamine (40% in methanol) at 0° C. under stirring. Then the mixture was stirred for 2 hours at 0° C. Removal of the solvent was followed by recrystallization from ethanol to yield snow-white MAX crystals.

Thin Film Preparation. The crystalline MAPbBr$_3$ thin films deposited on glass substrate were prepared through a two-step solution processed procedure. (6, 23) A thin layer of PbBr$_2$ was initially coated onto the glass substrate by spin coating a solution of PbBr$_2$ in DMF (100 mg/mL). The spin-coated PbBr$_2$ thin film was then annealed at 100° C. for 30 minutes. Subsequently, the as-annealed white PbBr$_2$ thin film was immersed into MABr solution in anhydrous isopropanol (10 mg/mL) for 15 minutes at room temperature, which yielded a yellow thin film. Finally the as-obtained yellow thin film was gently rinsed with isopropanol and annealed at 80° C. for 1 hour.

Crystallization of MAPbBr$_3$. PbBr$_2$ and MABr (1/1 by molar, 0.2 M) were dissolved in N,N-dimethylformamide (DMF). MAPbBr$_3$ single crystals were grown along with the slow diffusion of the vapor of the anti-solvent dichloromethane (DCM) in to the solution.

Crystallization of MAPbI$_3$. The same technique and anti-solvent for crystallizing MAPbBr$_3$ were used. PbI$_2$ and MAI (1/3 by molar, PbI$_2$: 0.5 M) were dissolved in gamma-butyrolactone (GBA).

Powder XRD characterization. Cu Kα$_I$ excitation (E=8047.8 eV) was employed for powder XRD measurements. Any remnant discrepancies in the relative peak intensities between the experimental and calculated powder XRD profiles stem from the specific surface orientation of the as-measured powders when exposed to the X-ray beam. ~50 pieces of crystals ranging from hundreds of micrometers to several millimeters were grounded into powder for powder XRD measurement to confirm the phase purity.

Single crystal X-ray diffraction. A small fraction (~0.1 mm×0.1 mm×0.1 mm) was cleaved from the as-grown MAPbX$_3$ (X=Br$^-$ or I$^-$) crystals (FIGS. 2.5A-B). Data were collected on a STOE IPDS 2 diffractometer at 270 K using graphite-monochromated Mo—K$_α$ radiation (λ=0.71073 Å). For MAPbBr$_3$ single crystals, the unit cell was determined using 606 reflections from 48 measured frames (cubic, space group P m3m (no. 221), a=5.9140(7) Å) confirming the single crystalline nature of the used material. The single crystalline nature was also established similarly for the as-grown MAPbI$_3$ single crystals (tetragonal, space group I 4/mcm, a=b=8.8061 Å, c=12.7019 Å). The crystal structure was refined using SHELXL-97 software. Detailed refinement parameters are given sections VI and VII.

Absorbance. The high transparency of the MAPbBr$_3$ single crystal enabled us to record its UV-Vis absorbance in transmission mode, while the colorless mother liquor did not absorb in the wavelength region defined in FIG. 2.2, and thus was used as a baseline reference for the absorption measurements. Storing the single crystals in the mother liquor also protects the surface from reconstructions caused by prolonged dewetting or exposure to air. The absorption of MAPbI$_3$ single crystal was recorded in reflection mode.

Time-dependent photoluminescence. Photoluminescence (PL) decay measurements were performed using a Horiba Fluorolog setup in reflection geometry. A transient population of carrier is impulsively excited in the sample (maintained in a dark environment) using an ultraviolet LED source (λ=355 nm, Δt~0.7 ns) and a red laser diode (λ=633 nm, Δt~0.8 ns) for MAPbBr$_3$ and MAPbI$_3$, respectively. The time-dependent photoluminescence signal is spectrally resolved using a single-grating spectrometer and acquired using a time-correlated detector operated in single-photon-counting mode. The presence of an impulsive, resolution-limited term in the time trace, is due to scattered laser light propagating in the spectrometer, and has been subtracted out in the analysis of carrier dynamics.

For the analysis of the time-resolved traces, multi-exponential profiles are used as trial fit functions. The metric used to assess the effectiveness of a particular type of fit function is the reduced chi-square $\chi_{red}^2$, which allows comparing functions with different number of fit parameters on the same quantitative grounds:

$$\chi_{red}^2 = \frac{1}{N-p-1} \sum_i (y_i - f(t_i))^2$$

where $y_i(t_i)$ are the experimental PL counts (time delays), $f(t)$ is the model fit function, N is the total number of points, and p is the number of free parameters. The model which minimizes the reduced chi-square is the one which attains the maximum likelihood of reproducing the experimental data.

An example of this procedure is shown in FIG. 2.8, which compares a bi- and tr-exponential fit on the MAPbBr$_3$ single crystal PL decay traces. The value of $\chi_{red}^2$ is lower for the bi-exponential fits, quantitatively demonstrating that a two-decay model is sufficient to reliably reproduce the experimental dataset.

Transient-absorption measurements. Nanosecond pump-probe TA spectroscopy was carried out using an EOS spectrometer to cover the ns to μs time window. The detailed experimental setup of EOS is provided elsewhere (24). Briefly, we employed a white-light continuum probe pulse that was generated by a super continuum source. To generate the excitation pulse, 800 μJ of the Spitfire output is used to pump TOPAS-C two stage parametric amplifier equipped with frequency mixing stages and non-collinear difference frequency generator that allows tuning from 236 to 26000 nm. TOPAS-C output beam at 475 nm is routed via adjustable pinholes, variable neutral density filter, depolarizer, chopper wheel and focusing lens to excite the sample. Pump and probe beams are overlapping spatially and temporally in the sample. Finally, the absorbance change of the probe beam is collected by the ESO spectrometer to record the time-resolved TA spectra.

TOF carrier mobility. The Time-of-flight (TOF) technique relies on pulsed light excitation with energy larger than the material's bandgap i.e. $\hbar\omega > E_g$; an absorption depth much smaller than the sample thickness d; a transparent electrode allowing light illumination on one side; and an RC time constant of the detection circuitry much smaller than the transit time $\tau_t$. The carrier mobility can be derived starting from its definition $v=\mu E$, where $v$ is the carrier velocity, obtained from the ratio between the sample thickness and transit time ($v=d/\tau_t$), while the electric field is simply given by $E=V/d$. Altogether this leads to the formula $\mu=d^2/V\tau_t$, which is used to extract the mobility values in FIG. 2.3B.

For this study, TOF measurements were performed using a Keithley 2400 as the power source and an Agilent infiniium DSO 8104A oscilloscope for acquiring the transient signal. Monochromatic light excitation was provided by a pulsed laser at the wavelength of 355 nm. Pulses of 5 ns length at a frequency of 200 Hz were produced. The sample was kept in an enclosed, dark environment under vacuum at room temperature. A top transparent ITO and bottom MoO$_3$/Au/Ag stack electrode were utilized to apply the driving voltage that induces the charges to drift through the thickness of the crystal.

I-V measurements (SCLC). Current as a function of the applied voltage was measured using a Keithley Sub-femto-amp 6340, using a rather simple geometry with two electrodes on opposite sides of the sample, which is kept under vacuum (p~$10^{-4}$ mbar) and in the dark. Ohmic contacts were deposited on opposite sides of the sample by consecutive thermal evaporation of MoO$_3$, Au, and Ag. The sample was kept in a dark environment, under vacuum at monitored room temperature. A non-linear response was observed and analyzed according to SCLC theory. The link between the trap density and the onset voltage of the trap-filled-limit (TFL) regime is $V_{TFL}=en_t d^2/2\varepsilon\varepsilon_0$, where $\varepsilon_0$ is the vacuum permittivity (14), while $\varepsilon$ represents the material's dielectric constant—here we use $\varepsilon=25.5$ (25).

Density Functional Theory (DFT). Calculations were performed within the Density Functional (DFT) formalism using the Perdew-Burke-Ernzerhof (PBE) (26) GGA exchange correlation functional. All calculations were performed utilizing the CP2K (27) package within Gaussian-augmented plane waves (GAPW) dual basis set using the molecular optimized double ζ-valence polarized (m-DZVP) (27) basis which have very small basis set superposition error (BSSE) (28-31). The plane-wave cutoff was 300 Ry, which is suitable for the Goedecker-Teter-Hutter pseudopotentials (32). Spin polarized (LSDA) and spin-unpolarized calculations (LDA) were performed in the case of the odd-even number of electrons. The structural minimization was performed with the help of the Broyden-Fletcher-Goldfarb-Shanno algorithm (BFGS) (33) in the case of the CP2K. Lattice constants were optimized and used throughout the calculations. The structural optimization was considered converged if the forces acting on the atoms were less than 0.04 eV·Å$^{-1}$. CP2K is a Γ-point code, therefore a sufficient number of unit cells is required to guarantee the convergence. In our case, we have used 4×4×4 supercell of the original cubic unit cell for the defect calculations. Basis-set superposition error (BSSE) (28, 34) was estimated via the Counterpoise correction method (35) and found to be of the order of 50 meV which is very small and was incorporated into final results. No spin-orbit coupling (SOC) has been taken into account, which was shown to be important (36) in calculating the bandstructure, however DFT-GGA calculations (36-39) without SOC effects were shown to capture semi-quantitative behaviour. In addition, SOC effects have been estimated to give small correction on the order of 0.25 eV since defect formation energies are the ground state properties. Good agreement of the DFT bandgap between experiment and theory is largely attributed to large error cancellation (36, 37). In the present manuscript we are mainly interested in the ground state properties, which are basically related to the valence band manifold. The VBM and CBM character have been evaluated by density-of-states and wavefunction analysis. The structural relaxation of the MAPbBr$_3$ cubic unit cell led to the lattice parameters being a=b=c=6.02 Å, which is in a good agreement with previous results (40). The calculated bandgap with these cell parameter is $E_g$~2 eV (see density of states plot in FIG. 2.13), which is in a good agreement with the experimental one (see FIG. 2.2A). Defect formation energies computation procedure with all the corrections needed can be found elsewhere (41).

The origins of low trap densities: insights from DFT.

In order to understand the origins of the exceedingly low trap density observed experimentally, we carried out DFT simulations of the electronic structure of MAPbBr$_3$. Specifically, we examined defect formation energies under different growth conditions. The initial structure was relaxed, yielding a unit cell lattice parameter of α=6.02 Å. The MAPbBr$_3$ formation energy, measured relative to its precursors MABr and PbBr$_2$, is found to be −0.2 eV. This is larger (in magnitude) compared to MAPbI$_3$, likely explaining the higher stability of Br-based perovskite films. We computed the defect formation energies of all major deep defects under Br-rich (FIG. 2.13) and Br-poor (FIG. 2.14) growth conditions.

Under a Br-rich environment (shaded area) there is a wide range of possible Fermi levels (i.e. of doping values) that are free of deep traps, because of the high formation energies of the latter. In contrast, in the case of a Br-poor/Pb-rich environment, this region is limited to the p-side and is a much narrower window. It is therefore preferable to grow the perovskite under Br-rich condition in order to have a wide process window for trap-free bromide perovskites.

We also calculated the binding energies of various complex defects, such as: (i) antisites $A_B$ (B occupying the atomic position of A); (ii) vacancies $V_A$ (missing A species); (iii) interstitials $A_i$ (species A found at a forbidden location in the lattice). The binding energies of $Pb_{Br}$ and $Br_{Pb}$ antisites at various charged states are given by (42):

$$E_b[(V_{Pb}+Br_i)^q] = E_f[Pb_{Br}^q] - E_f[V_{Pb}^n] - E_f[Br_i^m]$$

$$E_b[(V_{Br}+Pb_i)^q] = E_f[Br_{Pb}^q] - E_f[V_{Br}^n] - E_f[Pb_i^m]$$

where $E_b$ is the defect binding energy, whereas $E_f$ is the defect formation energy of the various defects with a, m, n charged states (q=m+n). The binding energies are given below, in eV (negative means stable, positive means unstable):

$$E_b(Pb_{Br}^0 \rightarrow V_{Pb}^0 + Br_i^0) = 0.20745$$

$$E_b(Pb_{Br}^{-3} \rightarrow V_{Pb}^{-2} + Br_i^{-1}) = 2.3584$$

$$E_b(Pb_{Br}^{-2} \rightarrow V_{Pb}^{-1} + Br_i^{-1}) = 1.1668$$

$$E_b(Pb_{Br}^{-2} \rightarrow V_{Pb}^{-2} + Br_i^0) = 2.3739$$

$$E_b(Pb_{Br}^{-1} \rightarrow V_{Pb}^{-1} + Br_i^0) = -0.45095$$

$$E_b(Pb_{Pb}^{-1} \rightarrow V_{Pb}^{-2} + Br_i^{+1}) = 1.8364$$

$$E_b(Pb_{Br}^{-1} \rightarrow V_{Pb}^0 + Br_i^{-1}) = -0.2093$$

$$E_b(Br_{Pb}^0 \rightarrow V_{Br}^0 + Pb_i^0) = 1.2946$$

$$E_b(Br_{Pb}^{+3} \rightarrow V_{Br}^{+1} + Pb_i^{+2}) = 1.3297$$

$$E_b(Br_{Pb}^{+2} \rightarrow V_{Br}^{+1} + Pb_i^{+1}) = 1.7364$$

$$E_b(Br_{Pb}^{+2} \rightarrow V_{Br}^0 + Pb_i^{+2}) = 0.62092$$

$$E_b(Br_{Pb}^{+1} \rightarrow V_{Br}^0 + Pb_i^{+1}) = 1.5627$$

$$E_b(Br_{Pb}^{+1} \rightarrow V_{Br}^{+1} + Pb_i^0) = 1.2593$$

The only complex which appears to be stable is $Pb_{Br}^{-1}$, which however is prone to decompose into the most stable $V_{Pb}^{-2}$ and $Br_i^{+1}$ defects. Ultimately, no complexes are found to be stable, since $Pb_{Br}$ always decomposes into lead vacancy ($V_{Pb}$) and Br-interstitial ($Br_i$), while $Br_{Pb}$ always decomposes into the bromide vacancy ($V_{Br}$) and Pb-interstitial ($Pb_i$). While the formation of $Pb_{Br}$ and $Br_{Pb}$ antisites during growth is not prevented a priori, such defects tend to decompose under energy-activating mechanisms such as annealing or light soaking. $Br_i$ in the oxidation state +1 has a very narrow stability region which only occurs for strongly p-type crystals, and thus singles out $Pb_i$ as the only major deep defect. This defect has a higher formation energy in the case of Br-rich than for Br-poor synthesis (see FIGS. 2.13 and 2.14), yielding a final lower density of trap states in the former case. One way to control the richness/poorness of the growth environment is to choose a lead precursor that brings with it an excess of bromide: $PbBr_2$, as used in the present work. Altogether, the DFT calculations of formation energies of the major defect states in $MAPbBr_3$ confirms that a Br-rich synthesis leads to a low trap density, as observed experimentally.

References, Example 2

1. National Renewable Energy Laboratoty, Research Cell efficiency Records Chart; http://www.nrel.gov/ncpv/images/efficiency_chart.jpg
2. A. Kojima, K. Teshima, Y. Shirai, T. Miyasaka, *J. Am. Chem. Soc.* 131, 6050-6051 (2009).
3. T. C. Sum, N. Mathews, *Energy Environ. Sci.* 7, 2518-2534 (2014).
4. C. Wehrenfennig, M. Liu, H. J. Snaith, M. B. Johnston, L. M. Herz, *Energy Environ. Sci.* 7, 2269-2275 (2014).
5. S. D. Stranks et al., *Science* 342, 341-344 (2013).
6. D. B. Mitzi, *Prog. Inorg. Chem.* 48, 1-121 (1999).
7. Y. Tidhar et al. *J. Am. Chem. Soc.* 136, 13249-13256 (2014).
8. M. Xiao et al. *Angew. Chem.* 126, 10056-10061 (2014).
9. See supplementary materials on Science Online
10. J. J. Choi et al. *Nano Lett.* 14, 127-133 (2013). 11. J. R. Haynes, W. Shockley, *Phys. Rev.* 81, 835-843 (1951).
12. G. Giorgi, K. Yamashita, J. Mater. Chem. A DOI: 10.1039/c4ta05046k (2015)
13. E. Edri, S. Kirmayer, D. Cahen, and G. Hodes, *J. Phys. Chem. Lett.* 4, 897-902 (2013)
14. M. A. Lampert, P. Mark, *Current injection in solids.* (Academic Press, 1970).
15. J. R. Ayres, *J. Appl. Phys.* 74, 1787-1792 (1993).
16. I. Capan, V. Borjanović, B. Pivac, *Sol. Energy Mater. Sol. Cells* 91, 931-937 (2007).
17. A. Balcioglu, R. K. Ahrenkiel, F. Hasoon, *J. Appl. Phys.* 88, 7175-7178 (2000).
18. J. Versluys, P. Clauws, P. Nollet, S. Degrave, M. Burgelman, *Thin Solid Films* 431-432, 148-152 (2003).
19. C. Goldmann et al., *Appl. Phys.* 99, 034507 (2006).
20. Y. S. Yang et al., *Appl. Phys. Lett.* 80, 1595-1597 (2002).
21. J. R. Haynes, J. A. Hornbeck, *Phys. Rev.* 100, 606-615 (1955).
22. J. A. Hornbeck, J. R. Haynes, *Phys. Rev.* 97, 311-321 (1955).
23. J. Burschka, N. Pellet, S.-J. Moon, R. Humphry-Baker, P. Gao, M. K. Nazeeruddin, M. Gratzel, *Nature* 499, 316-319 (2013).
24. A. O. El-Ballouli, E. Alarousu, M. Bernardi, S. M. Aly, A. P. Lagrow, O. M. Bakr, O. F. Mohammed, *J. Am. Chem. Soc.* 136, 6952-6959 (2014).
25. A. Poglitsch, D. Weber, *J. Chem. Phys.* 87, 6373-6378 (1987).
26. J. P. Perdew, K. Burke, M. Ernzerhof, *Phys. Rev. Lett.* 77, 3865-3868 (1996).
27. J. VandeVondele, J. Hutter, *J. Chem. Phys.* 127, 114105 (2007).
28. R. Leitsmann, O. Böhm, P. Plänitz, C. Radehaus, M. Schaller, M. Schreiber, *Surf. Sci.* 604, 1808-1812 (2010).
29. T. T. Takaluoma, K. Laasonen, R. S. Laitinen, *Inorg. Chem.* 52, 4648-4657 (2013).
30. N. Bork, V. Loukonen, H. Vehkamäki, *J. Phys. Chem. A.* 117, 3143-3148 (2013).
31. E. Smecca, A. Motta, M. E. Fragala, Y. Aleeva, G. G. Condorelli, *J. Phys. Chem. C* 117, 5364-5372 (2013).
32. C. Hartwigsen, S. Goedecker, J. Hutter, *Phys. Rev. B* 58, 3641-3662 (1998).
33. W. H. Press, *Numerical Recipes: The Art of Scientific Computing* (Cambridge University Press, ed. 3, 2007).

34. H. B. Jansen, P. Ros, *Chem. Phys. Lett.* 3, 140-143 (1969).
35. S. F. Boys, F. Bernardi, *Mol. Phys.* 19, 553-566 (1970).
36. J. Even, L. Pedesseau, J.-M. Jancu, C. Katan, *J. Phys. Chem. Lett.* 4, 2999-3005 (2013).
37. E. Mosconi, A. Amat, M. K. Nazeeruddin, M. Grätzel, F. De Angelis, *J. Phys. Chem. C* 117, 13902-13913 (2013).
38. W.-J. Yin, T. Shi, Y. Yan, *Appl. Phys. Lett.* 104, 063903 (2014).
39. S. Colella, E. Mosconi, P. Fedeli, A. Listorti, F. Gazza, F. Orlandi, P. Ferro, T. Besagni, A. Rizzo, G. Calestani, G. Gigli, F. De Angelis, R. Mosca, *Chem. Mater.* 25, 4613-4618 (2013).
40. G. Giorgi, J.-I. Fujisawa, H. Segawa, K. Yamashita, *J. Phys. Chem. C* 118, 12176-12183 (2014).
41. A. Buin, P. Pietsch, J. Xu, O. Voznyy, A. H. Ip, R. Comin, E. H. Sargent, Materials Processing Routes to Trap-Free Halide Perovskites. *Nano Lett.* 14, 6281-6286 (2014).
42. X. M. Duan, C. Stampfl, *Phys. Rev. B* 79, 174202 (2009).
43. S. D. Stranks, V. M. Burlakov, T. Leijtens, J. M. Ball, A. Goriely, H. J. Snaith, *Physical Review Applied* 2, 034007 (2014).
44. M. Razeghi, Fundamentals of solid state engineering (Springer, New York, ed. 3, 2009).

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

We claim at least the following:

1. A method of making a single crystal, comprising:
providing a first reservoir including a first liquid, wherein the first liquid includes a first precursor and an organic cation precursor dissolved in a first liquid solvent;
providing a second reservoir including a second liquid, wherein the second liquid is a non-solvent;
wherein the first reservoir and second reservoir are separated by a boundary so that the first liquid and the second liquid do not contact one another, wherein the first reservoir and the second reservoir are in a closed system;
allowing for vapor diffusion of the second liquid into the first liquid so that the solubility of the first precursor and organic cation precursor gradually decreases; and
precipitating out an organometallic halide perovskite single crystal in the first reservoir.

2. The method of claim 1, wherein the organometallic halide perovskite single crystal has the following formula: $AMX_3$, wherein A is an organic cation, M is selected from the group consisting of: Pb, Sn, Cu, Ni, Co, Fe, Mn, Pd, Cd, Ge, and Eu, and X is a halide.

3. The method of claim 1, wherein the first liquid solvent is selected from the group consisting of: N,N-dimethylformamide (DMF), dimethylsulfoxide (DMSO), gamma-butyl-rolactone (GBR), and a combination thereof.

4. The method of claim 3, wherein the first precursor is a halide salt of M, wherein M is selected from the group consisting of: Pb, Sn, Cu, Ni, Co, Fe, Mn, Pd, Cd, Ge, and Eu.

5. The method of claim 4, wherein the first precursor is selected from $PbBr_2$ or $SnBr_2$.

6. The method of claim 1, wherein the organic cation precursor is a halide salt of A, wherein A is an organic cation.

7. The method of claim 6, wherein the organic cation precursor is selected from the group consisting of: methylammonium bromide, methylammonium iodide, methylammonium chloride, formamidinium chloride, formamidinium bromide, ormamidinium iodide, and combination thereof.

8. The method of claim 1, wherein the non-solvent has a lower boiling point than the first liquid solvent, and the first precursor and the organic cation precursor are not soluble in the non-solvent.

9. The method of claim 1, wherein the non-solvent is selected from the group consisting of: dichloromethane, chloroform, acetonitrile, toluene, and a combination thereof.

10. The method of claim 1, wherein the organometallic halide perovskite single crystal is selected from the group consisting of: methylammonium lead chloride ($MAPbCl_3$), methylammonium lead iodide ($MAPbI_3$), methylammonium lead bromide ($MAPbBr_3$), formamidinium lead chloride ($FAPbCl_3$), formamidinum lead bromide ($FAPbBr_3$), formamidinum lead iodide ($FAPbI_3$), methylammonium tin chloride ($MASnCl_3$), methylammonium tin bromide ($MASnBr_3$), methylammonium tin iodide ($MASnI_3$), formamidinium tin chloride ($FASnCl_3$), formamidinium tin bromide ($FASnBr_3$), and formamidinium tin iodide ($FASnI_3$).

11. The method of claim 1, wherein the vapor diffusion proceeds at about room temperature and pressure.

12. The method of claim 1, further comprising adjusting a temperature and/or pressure of closed system to control the rate of formation of the organometallic halide perovskite single crystal.

13. The method of claim 1, wherein the organometallic halide perovskite single crystal is formed over a time period ranging from about an hour to one or more days.

14. The method of claim 1, wherein the first reservoir and the second reservoir are a single structure or separate structures.

\* \* \* \* \*